(12) United States Patent
Yamazaki et al.

(10) Patent No.: US 6,599,790 B1
(45) Date of Patent: Jul. 29, 2003

(54) LASER-IRRADIATION METHOD AND LASER-IRRADIATION DEVICE

(75) Inventors: Shunpei Yamazaki, Tokyo (JP);
Satoshi Teramoto, Kanagawa (JP);
Naoto Kusumoto, Kanagawa (JP);
Takeshi Fukunaga, Kanagawa (JP);
Setsuo Nakajima, Kanagawa (JP);
Tadayoshi Miyamoto, Nara (JP);
Atsushi Yoshinouchi, Nara (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 0 days.

(21) Appl. No.: 08/799,202

(22) Filed: Feb. 13, 1997

(30) Foreign Application Priority Data

| | | | |
|---|---|---|---|
| Feb. 15, 1996 | (JP) | ............................................. | 8-053738 |
| Mar. 23, 1996 | (JP) | ............................................. | 8-093367 |
| Jun. 11, 1996 | (JP) | ............................................. | 8-171895 |

(51) Int. Cl.$^7$ .......................... H01L 21/00; H01L 21/84
(52) U.S. Cl. ........................ 438/166; 438/308; 438/795; 438/798
(58) Field of Search ................................. 438/166, 308, 438/798, 795; 148/DIG. 3, DIG. 71

(56) References Cited

U.S. PATENT DOCUMENTS

| | | | |
|---|---|---|---|
| 3,667,832 A | 6/1972 | Kitano et al. | |
| 4,733,944 A | 3/1988 | Fahlen et al. | ................ 350/167 |
| 4,943,733 A | 7/1990 | Mori et al. | .................. 250/548 |

(List continued on next page.)

FOREIGN PATENT DOCUMENTS

| | | | | |
|---|---|---|---|---|
| JP | 6-124890 | 5/1994 | ........... | H01L/21/20 |
| JP | 6-124913 | 5/1994 | ........... | H01L/21/268 |
| JP | 6-295859 | 10/1994 | ........... | H01L/21/20 |

OTHER PUBLICATIONS

H. Hayashi et al., Fabrication of Low–Temperature Bottom–Gate Poly–Si TFTs on Large–Area Substrate by Linear–Beam Excimer Laser Crystallization and Ion Dopping Method, (IEDM), pp. 829–832, Dec. 1995.*
R.I. Johnson et al., Pulse to Pulse Laser Stability Effects on Multiple Shot Excimer Lser Crystallized a–si thin films, pp. 703–709, (Mat. Res. Soc. Symp. Proc. vol. 343. (MRS), 1994.*
Jhon et al., Crystallization of A–Si by Excimer Laser Annealing with a line shape beam having a guassian profile, pp. 1438–1441, Jpn. J. Appl. Phys. vol. 33, 1994.*
Mamoru et al., Bottom gate Poly–si TFTs Using XeCl Laser Annealing and Ion Doping Tech., pp. 1964–1969 (IEEE), 1993.*

(List continued on next page.)

*Primary Examiner*—Olik Chaudhuri
*Assistant Examiner*—Scott Brairton
(74) *Attorney, Agent, or Firm*—Fish & Richardson P.C.

(57) ABSTRACT

A laser-irradiation method which comprises a process for fabricating a semiconductor device, comprising: a first step of forming a thin film amorphous semiconductor on a substrate having an insulating surface; a second step of modifying the thin film amorphous semiconductor into a crystalline thin film semiconductor by irradiating a pulse-type linear light and/or by applying a heat treatment; a third step of implanting an impurity element which imparts a one conductive type to the crystalline thin film semiconductor; and a fourth step of activating the impurity element by irradiating a pulse-type linear light and/or by applying a heat treatment; wherein the peak value, the peak width at half height, and the threshold width of the laser energy in the second and the fourth steps above are each distributed within a range of approximately ±3% of the standard value. Also claimed is a laser irradiation device which realizes the method above.

47 Claims, 12 Drawing Sheets

U.S. PATENT DOCUMENTS

| | | | |
|---|---|---|---|
| 5,097,291 A | | 3/1992 | Suzuki et al. .................. 355/69 |
| 5,263,250 A | | 11/1993 | Nishiwaki et al. ......... 29/890.1 |
| 5,294,811 A | * | 3/1994 | Aoyama et al. |
| 5,498,904 A | * | 3/1996 | Harate et al. |
| 5,529,951 A | * | 6/1996 | Noguchi et al. |
| 5,561,081 A | * | 10/1996 | Takenouchi et al. |
| 5,643,801 A | | 7/1997 | Ishihara et al. .......... 250/492.1 |
| 5,712,191 A | * | 1/1998 | Nakajima |
| 5,821,562 A | * | 10/1998 | Makita et al. |
| 5,858,473 A | | 1/1999 | Yamazaki et al. .......... 427/554 |
| 5,891,764 A | | 4/1999 | Ishihara et al. ............. 438/151 |
| 6,168,980 B1 | | 1/2001 | Yamazaki et al. .......... 436/162 |

OTHER PUBLICATIONS

R.I. Johnson, et al., Pulse–To–Pulse Stability Effects on Multiple Shot Excimer Laser Crystallized a–Si Thin Films, Mat. Res. Soc. Proc., vol. 343, pp. 703–709, 1994.*

K.S. Pennington & J.M. White, "CCD Imaging Array Combining Fly's–eye Lens with TDI for Increased Light–Gathering Ability", IBM Technical Disclosure Bulletin, vol. 21, Jul. /1978.

\* cited by examiner

IMPURITY ION IMPLANTATION

LASER IRRADIATION

LASER-IRRADIATION METHOD AND LASER-IRRADIATION DEVICE

BACKGROUND OF THE INVENTION

1. Field of the Invention

The present invention relates to a method for annealing (laser annealing) a thin film semiconductor by irradiating a laser light. The objects of laser annealing include to crystallize an amorphous thin film, to improve the crystallinity of a crystalline thin film, to activate impurity elements for imparting conductivity, and the like.

2. Description of the Related Art

In recent years, a technique which comprises forming a thin film semiconductor on a glass substrate and then fabricating a thin film transistor by using the thus obtained thin film is known. This technique is essential for the fabrication of an active matrix liquid crystal display device.

An active matrix liquid crystal display device comprises pixel electrodes provided in a matrix-like arrangement and thin film transistors provided to each of the pixel electrodes in order to control the charge that is input and output from the pixel electrode.

In fabricating the active matrix liquid crystal display device, several hundred thousand of thin film transistors must be integrated in a matrix-like arrangement.

Thin film transistors utilizing a crystalline silicon film are capable of yielding high performance, and are preferred for use in the liquid crystal display device. When a crystalline silicon film is used, in particular, peripheral drive circuits using thin film transistors can be constructed on the same glass substrate. Thus, an advantageous constitution, which enables a more compact device at a simpler fabrication process at a lower fabrication cost, etc., can be implemented.

However, an active matrix liquid crystal device at present has problems of causing uneven display or forming stripe patterns in the display. Especially, the stripe patterns are particular in a liquid crystal display device fabricated through a laser annealing process, and they considerably impair the visual appearance of the displayed image.

The stripe patterns differ from point defects and line defects in that they become visually perceptible depending on the drive conditions of the liquid crystal display device. Thus, the present inventors assumed that this phenomena differs from the permanent defects attributed to, for example, the destruction of thin film transistors and the formation of short circuit in the wirings and the like.

Then, as a result of analyzing the liquid crystal display device from various viewpoints, it has been found that the fluctuation in ON current (the current which generates in selecting a pixel electrode) greatly influences the generation of stripe patterns.

For instance, when a thin film transistor is selected in an active matrix liquid crystal display device, an ON current generates between the source region (connected to a data line) and the drain region (connected to a pixel electrode) of the active layer as to realize a particular state (charged state) in which a certain voltage is applied to the liquid crystal.

Thus, in case the ON current is extremely small, a problem may happen that the charge is insufficient for a pixel electrode. In such a case where the saturated charge is not attained, it becomes impossible to realize the desired grayscale display, and those pixel regions with insufficient display are observed as stripe patterns.

Furthermore, there occurs a phenomenon of causing slight drop in the voltage written in the pixel electrode immediately after a thin film transistor is switched from an ON state to an OFF state (or from an OFF state to an ON state). The fluctuation in voltage is called as a "field through voltage".

The field through voltage is another factor causing stripe patterns, because the charge stored in the pixel electrode also changes with the field through voltage.

However, in general, the field through current is relaxed by a compensation current which generates between the source/drain (hereinafter referred to as "a field-through compensation current"). The field-through compensation current is a current that generates within a short period of time in switching the thin film transistor from an ON state to an OFF state (or reverse).

The present inventors analyzed the trial-fabricated thin film transistor, and as a result, it has been found that, with increasing ON current, the field-through compensation current increases, i.e., that the field-through voltage becomes more relaxed.

The analyzed results above can be summarized as follows. That is, the long-unsolved problem of the generation of stripe patterns in a liquid crystal display device is attributed to the fluctuation in ON current of a thin film transistor, and the best solution of the problem is to overcome the fluctuation in ON current.

Furthermore, the present inventors simulated the generation of stripe patterns ascribed to insufficient charging described above by means of simulation. The simulation was performed by calculating the time necessary for charging 99.6% or more of the pixel capacitance of about 0.2 pF (a total capacitance of a capacitance of the liquid crystals and the auxiliary capacitance).

Based on the fact that the fly-back time in VGA is 5 $\mu$s, and including margin, the results were evaluated by judging whether the pixel capacitance can be charged in a period of 2 $\mu$s or not.

As a result, it was confirmed that an ON current (at a drain voltage Vd=14 V and a gate voltage Vg=10 V) of 3 $\mu$A or higher is necessary in case of a thin film transistor with a threshold voltage of about 2 V.

In the light of the aforementioned circumstances, the present inventors came to a conclusion that it is necessary and indispensable to improve the crystallinity of the semiconductor layer (i.e., the crystalline silicon film in this case) which greatly influences the ON current above.

The crystalline silicon film above can be obtained by crystallizing an amorphous silicon film by applying heat treatment, irradiating a laser light, or by utilizing the both. In particular, the method of using laser light (said method hereinafter referred to as "laser crystallization") as a crystallizing means or as a means for improving the crystallinity is effective from the viewpoint that it enables a crystalline silicon film having excellent crystallinity at a low temperature.

This method of forming a crystalline silicon film at a low temperature is advantageous in that a high performance thin film transistor can be fabricated on an inexpensive glass substrate. Accordingly, this method is surely a promising means for crystallization.

A pulse-emitting excimer laser is most frequently used in the method utilizing a laser light irradiation. The method using an excimer laser comprises emitting a laser having a wavelength in the ultraviolet region by applying a high frequency discharge to a predetermined type of gas and thereby realizing a particular excitation state.

In case of forming a crystalline silicon film by irradiating a laser light, however, there is a problem that not always good reproducibility is obtained on the crystallinity of the resulting crystalline silicon film. This is due to the influence of the parameters included in the process steps from the formation of a silicon film to the completion of laser annealing treatment.

The parameters included in the process steps are factors influencing the laser crystallization, and are uncertain factors influencing the crystallinity. They include indirect factors such as the film thickness of the amorphous silicon film and the direct ones such as the irradiation energy of the laser.

In case of an excimer laser, for instance, the presence of fluctuation in the irradiation energy per pulse of the emitted laser light is found as a problem. Furthermore, the fluctuation in the irradiation energy of the laser and the scattering in energy distribution in the superposed emissions of laser light are known to induce non-uniform crystallinity.

For example, the inventors use a laser device in which the laser is linearly beam-processed to provide laser-irradiated surfaces that are superposed on each other. Accordingly, the heterogeneity in energy distribution directly induces the fluctuation in ON current as to form transverse stripe pattern in the image display region.

As described in the foregoing, the stripe patterns provide a fatal problem in manufacturing a commercially feasible liquid crystal display device. Thus, early solution to the problem is keenly demanded. However, by employing the laser device at the present level of technology, it is almost impossible to form a crystalline silicon film having a crystallinity which induces perfectly no fluctuation in ON current, which is the cause of stripe patterns.

In other words, this problem is the rate-determining factor in the evolution of liquid crystal display device utilizing the low temperature polysilicon technique based on laser crystallization technique.

SUMMARY OF THE INVENTION

An object of the present invention is to provide a technique to overcome the aforementioned problems, which is capable of performing laser annealing with excellent uniformity and reproducibility, and to provide a device for implementing the technique. It is also an object of the present invention to provide, by applying the technique above, a technique for fabricating a liquid crystal display device capable of forming an image with high quality and free of stripe patterns.

According to one aspect of the present invention, there is provided a laser-irradiation method which comprises a process for fabricating a semiconductor device, comprising:

- a first step of forming a thin film amorphous semiconductor on a substrate having an insulating surface;
- a second step of modifying the thin film amorphous silicon into a crystalline thin film semiconductor by irradiating a laser light and/or by applying a heat treatment;
- a third step of implanting an impurity element which imparts a single conductive type to the crystalline thin film semiconductor; and
- a fourth step of activating the impurity element by irradiating a laser light and/or by applying a heat treatment;
- wherein the peak value, the peak width at half height, and the threshold width of the laser energy in the second and the fourth steps above are each distributed within a range of approximately ±3% of the standard value.

In the light of the aforementioned problems of conventional techniques, the present inventors assumed that the non-uniformity in crystallinity becomes apparent as a result of the mixing of a plurality of uncertain factors such as the afore-mentioned thickness of the amorphous silicon film, etc.

Accordingly, the principal object of the present invention is to suppress and minimize the fluctuation in the parameters encountered in the process steps which directly or indirectly influence the laser crystallization process. Furthermore, another object is to eliminate the uncertain factors as much as possible, while suppressing the fluctuation in the parameters.

Referring to FIG. 1, for instance, in the fabrication of a crystalline silicon film by irradiating a pulse-emitted linear laser light, there is observed a fluctuation in the irradiation energy of the laser light (i.e., the fluctuation in irradiation energy with respect to the time of irradiation).

The data shown in FIG. 1 illustrates the fluctuation in the laser output (the laser energy or the irradiation energy) per pulse of the emitted radiation (i.e., the fluctuation in irradiation energy with respect to the passage in irradiation time). In case an appropriate beam formation is performed by using an optical system, the fluctuation corresponds to the fluctuation in the density of irradiated energy per shot on the irradiated surface.

In other words, although the irradiated energy is taken here in the ordinate, it is also possible to convert it and express it in terms of energy density. The laser output herein shows the peak value (maximum value) of the laser energy.

Referring to FIG. 1, it is to be noticed that the peak values of the laser output are distributed roughly within a range of ±3% of 640 mJ; i.e., the peak values fall within a range of ±3% of a certain standard value (optimum value). In the case of the laser device used by the inventors, the energy density for an irradiated unit area at a laser output of 640 mJ is about 250 mJ/cm$^2$.

According to the study of the present inventors, it is known that, when laser annealing is performed with a fluctuation larger than the range above, the annealing effect becomes scattered, or the uniformity in the surface becomes impaired.

Incidentally, in case a higher uniformity must be achieved in laser annealing, the distribution range in laser output is narrowed to within ±2%, preferably to within ±1.5%, though this may have the expense of complicated control and increased cost.

Accordingly, considering the annealing of a semiconductor film with reference to FIG. 1, the fluctuation in laser output per pulse emission is constrained to within ±3%, preferably within ±2%, and more preferably, within ±1.5%. These constraints are particularly preferable in case of annealing a large area using a linearly emitted light of laser.

Further, to eliminate the aforementioned stripe patterns, it is also required not only to suppress the fluctuation in peak values, but also to suppress the fluctuation in various parameters related to the crystallization process, and to remove as much as possible the uncertain factors in laser crystallization.

In accordance with another aspect of the present invention, there is provided a laser-irradiation device for irradiating a laser light to a thin film semiconductor provided on a substrate having an insulating surface, comprising:

means for emitting the laser light;
  a gas processor connected to the means for emitting the laser light;
  a control unit for controlling the output of the laser light by detecting a part of the laser light and then feeding back the detected result to the means for emitting the laser light;

optical means for shaping the laser light into a linear beam; and means for heating the thin film semiconductor; wherein, the peak value, the peak width at half height, and the threshold width of the laser energy are each distributed within a range of approximately ±3% of the standard value.

Furthermore according to still another aspect of the present invention, there is provided a laser-irradiation device for irradiating a laser light to a thin film semiconductor provided on a substrate having an insulating surface, comprising:

means for emitting laser light;

a gas processor connected to the means for emitting the laser light;

a control unit for controlling the output of the laser light by detecting a part of the laser light and then feeding back the detected result to the means for emitting the laser light;

optical system means for shaping the laser light into a linear beam;

means for heating the thin film semiconductor; and an auxiliary heating device provided in addition to the means for heating the thin film semiconductor; wherein, the peak value, the peak width at half height, and the threshold width of the laser energy are each distributed within a range of approximately ±3% of the standard value.

Referring to FIG. 7, the laser device employed in the present invention is briefly described below. The laser device illustrated in FIG. 7 is necessary for providing a laser energy distributed in a range shown in FIG. 1.

Referring to FIG. 7, the pulsed light emitted from a laser generator 702 is processed into a pulse beam having a linear cross section by using an optical system 706, reflected by a mirror 707, and is irradiated to an object substrate 709 through a quartz window 708 into a laser irradiation chamber 701.

As the light emitted from the laser generator 702, usable are radiations in the ultraviolet region, such as a KrF excimer laser (having a wavelength of 248 nm), an XeCl excimer laser (having a wavelength of 308 nm), and fourth harmonics (having a wavelength of 265 nm) of a xenon-lamp excited Nd:YAG laser.

Furthermore, a gas processor 703 is connected to the laser generator 702. The gas processor 703 corresponds to an excited gas purifier for removing halides (i.e., fluorides in case of KrF excimer laser and chlorides in case of XeCl excimer laser) generated inside the laser generator 702.

A half mirror 704 is provided between the laser generator 702 and the optical system 706 above, so that a part of the laser output is taken out and detected by a control unit 705. The control unit 705 controls the discharge power of the laser generator 702 in correspondence with the fluctuation in the detected laser energy.

The object substrate 709 is placed on a stage 711 provided on a substrate support table 710, and is maintained at a predetermined temperature (300 to 650° C.) by a heater provided inside the substrate support table 710. The stage 711 is equipped with a thermocouple 712 so that the measured result may be feed back immediately to control the heater.

Furthermore, the laser irradiation chamber 701, whose atmosphere is controllable, is equipped with a vacuum evacuation pump 713 as a means for reducing pressure and for evacuation. The vacuum evacuation pump 713 is capable of realizing high degree of vacuum, e.g., a turbo molecular pump and a criosorption pump.

A gas supply pipe 714 connected to an $O_2$ (oxygen) gas bomb via a valve and a gas supply pipe 715 connected to a He (helium) gas bomb via a valve are provided as a gas supply means. Preferably, the gas used herein has a purity of more than 99.99999% (7N).

In the laser irradiation chamber 701 having the constitution described above, the substrate support table 710 is moved in a direction making a right angle with respect to the linear direction along the linear laser beam. This constitution allows the laser beam to be irradiated while scanning the upper surface of the object substrate 709.

A gate valve 717 is provided as an inlet and outlet for charging and discharging the object substrate 709, and is connected to an external substrate transport chamber.

Referring to FIG. 8, the process for processing the pulsed laser beam inside the optical system 706 (shown in FIG. 7) is briefly described below.

Firstly, by using an optical system consisting of optical lenses 801 and 802, the laser light emitted from a laser generator is shaped into a laser light having a predetermined beam shape and a predetermined distribution of energy density.

The distribution of energy density in the resulting laser light is corrected by two homogenizers 803 and 804.

The homogenizer 803 has a function of correcting the energy density in the width direction within the finally obtained linearly shaped beam.

The homogenizer 804 has a function of correcting the energy density in the longitudinal direction within the finally obtained linearly shaped beam. Because the laser beam is extended in the longitudinal direction for a length of 10 cm or more, the setting of the optical parameters of the homogenizer 804 must be carried out with great care.

Optical lenses 805, 806, and 808 are provided to linearly shape the laser beam. In addition, a mirror 807 is provided.

In the constitution according to the present examples, 12 cylindrical lenses (each having a width of 5 mm) constitute the homogenizer 804. The incident laser beam is split into approximately 10 beams.

That is, the homogenizer is arranged with a little margin with respect to the laser light so that the inner ten cylindrical lenses are mainly used.

In the present example, the finally obtained length of the laser radiation energy in the longitudinal direction of the laser radiation is 12 cm.

By employing the constitution above, the unevenness in energy density of a linear laser light can be eliminated, and uniform annealing can be applied to a semiconductor material.

DETAILED DESCRIPTION OF THE INVENTION

Figure 1:
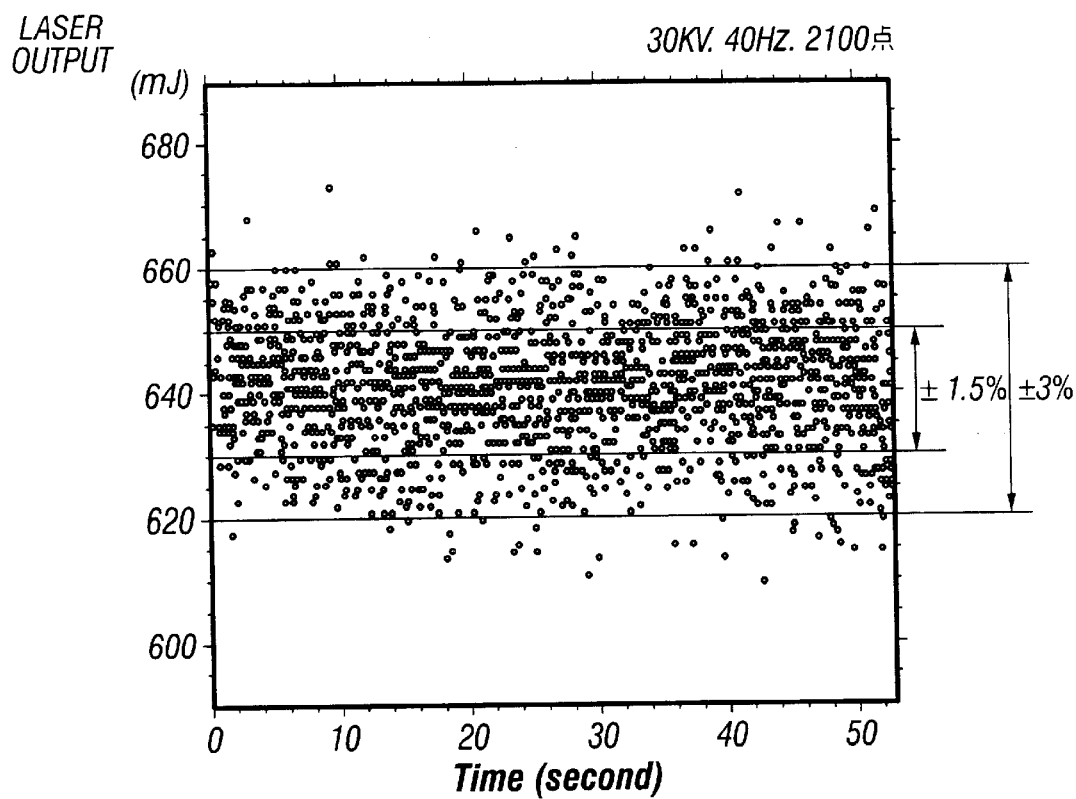
FIG. 1 shows the fluctuation in the energy density of the irradiated laser per pulse.

In the present invention, the distribution of fluctuation in various parameters influencing either directly or indirectly the laser crystallization process in annealing a semiconductor film using a pulse-emitting type excimer laser is constrained. In this manner, a crystalline silicon film having high uniformity can be obtained with high reproducibility.

The constitution of the present invention is described in further detail by making reference to the examples below. It should be understood, however, that the present invention is not to be construed as being limited thereto.

EXAMPLE 1

The present example describes a case of fabricating a thin film transistor according to the invention disclosed by the present specification. FIGS. 2A to 2E show the steps of a process for fabricating a thin film transistor of the present example.

The step of laser annealing in the present example accelerates the crystallization of the amorphous silicon film and the activation of the impurity ions implanted in the active layer.

First, a 2,000-Å-thick silicon oxide film is formed on a glass substrate 201 as an underlying film 202 by means of sputtering or plasma CVD. Particularly, when sputtering method using an artificial quartz target is employed, the grain diameter of each crystal of crystalline silicon film formed later increases so as to form an active layer with high crystallinity.

An amorphous silicon film 203 is formed thereafter by means of plasma CVD or low pressure thermal CVD at a film thickness of from 100 to 2,000 Å (preferably from 100 to 1,000 Å, representatively, from 200 to 500 Å). The amorphous silicon film 203 has a film thickness distributed within a range of ±5%, preferably within a range of ±2.5%, in the surface of the substrate.

Because the film thickness depends on the total combination of the various film deposition conditions such as the gas pressure, the distance between substrates, etc., there is no universal rule concerning the means for controlling the film thickness within the surface of the substrate. However, for instance, considering the fact that the film thickness distribution in the edge of an object substrate becomes impaired due to the influence of the change in gas flow and the like, a susceptor larger than the substrate may be prepared in advance, so that a constitution in which the substrate is fit only within a region having favorable film thickness distribution is realized. An amorphous silicon film with high uniformity can be readily obtained in this manner.

The fluctuation in film thickness of the amorphous silicon film 203 is not preferred because it is directly related with the fluctuation in the crystallinity of the crystalline silicon film. Accordingly, a crystalline silicon film with high uniformity can be obtained by constraining the fluctuation in film thickness within the aforementioned range.

From the viewpoint of improving the density of the film and the crystallinity of the crystalline silicon film, the amorphous silicon film 203 is preferably formed by means of low pressure thermal CVD.

In forming the film utilizing low pressure thermal CVD, disilane ($Si_2H_6$), trisilane ($Si_3H_8$), etc. is used as a starting gas material. The film formation is performed in a temperature range of from 420 to 500° C. In the present example, a 500-Å-thick amorphous silicon film 203 was formed at a film formation temperature of 450° C. by using disilane. To obtain a film with uniform film quality and thickness, the fluctuation in film formation temperature (the temperature within the substrate surface) was controlled so that the fluctuation may fall within a range of ±1° C.

In general, the film formation temperature is maintained by using a heating means such as a heater, but with increasing size of the object substrate, the use of a sheet-wise system becomes dominant. In such a case, a heating means using lamp annealing is effective in achieving a uniformly distributed temperature.

In both cases of using heater or lamp annealing, a thermocouple is provided to the stage (inclusive of a susceptor) for supporting the substrate, and the measured results are fed back for the temperature control.

Figure 2A:
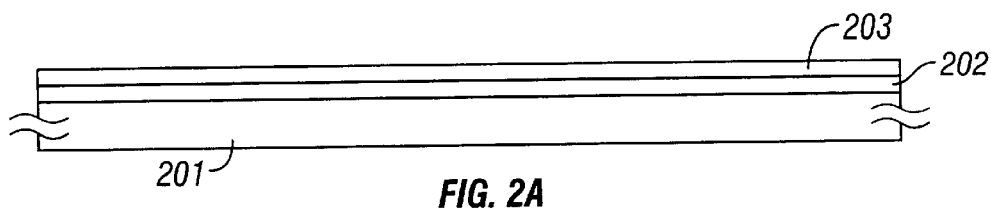
FIGS. 2A to 2E show the process steps in fabricating a thin film transistor.

Thus is obtained a state illustrated in FIG. 2A. Once this state is obtained, the crystallization step is performed by irradiating laser to the amorphous silicon film 203. The laser crystallization step is carried out by using a laser device above having a constitution illustrated in FIG. 7.

Laser light for use in the present example include an excimer laser using XeCl, KrF, ArF, etc., as the excitation gases, or a fourth harmonic of an Nd:YAG laser and the like. In the present example, however, a KrF excimer laser (emitting light at a wavelength of 248 nm) is employed. In case the load to the optical system and the laser generator should be further minimized, it is effective to use an XeCl excimer laser emitting light at a wavelength of 308 nm longer than that of KrF excimer laser and therefore having a weaker photon energy.

Laser annealing is performed under an atmosphere containing helium. Helium has a low specific heat and excels in heat conductivity. These characteristics are extremely effective in accurately controlling the substrate temperature.

In case of performing laser annealing in an atmosphere containing oxygen, the surface roughening of the silicon film can be prevented from occurring because the surface of the silicon film is protected by the formation of a naturally oxidized film during processing. The suppression of the formation of rough surface is extremely effective in case a thin film transistor is completed, and a favorable MOS interface is to be formed.

Accordingly, by introducing gaseous oxygen and gaseous helium at a ratio of 1:1 through gas supply pipes 714 and 715, laser annealing is performed under a mixed gas atmosphere containing gaseous oxygen and gaseous helium at a gas pressure in a range of from 1 to 760 Torr.

Thus, the temperature distribution in the surface of the object substrate can be accurately controlled, and the surface roughening of the silicon film can be suppressed to a minimum level.

In addition, from the viewpoint of avoiding inclusion of an impurity into the film during the irradiation of laser, it is furthermore preferred to introduce gaseous helium and gaseous oxygen with a purity level exceeding 7N.

To maintain the gas purity at a high level, it is also effective to circulate the gaseous atmosphere inside the laser irradiation chamber 701 during the laser irradiation process. For instance, fresh gas may be introduced continuously while evacuating used gas, or a gas processor and the like may be installed to constantly purify the gas atmosphere.

Furthermore, in forming the gaseous atmosphere above, it is preferred to previously remove C (carbon) and N (nitrogen) elements inside the laser irradiation chamber 701 as much as possible. The compounds of C and N elements, such as $NH_3$, CO, and $CO_2$ may be found as factors having bad influence on semiconductor devices.

Furthermore, C and N elements may form hard coating such as $SiC_x$ or $SiN_x$ on the surface of the silicon film, and are suspected to later induce contact failure in the source/drain regions.

Thus, it is preferred to introduce gaseous oxygen and gaseous helium after evacuating the laser irradiation chamber 701 to attain a high degree of vacuum of $10^{-6}$ Torr or lower. By thus maintaining the inside of the laser irradiation chamber to a state as clean as possible, the concentration of impurities containing C or N elements in the composition may be lowered to a level of 1 ppm or even lower.

As described in the foregoing, the laser device for use in the present example enables a highly clean vacuum state by evacuating the laser irradiation chamber 701 employing a vacuum evacuation pump capable of realizing high degree of vacuum, e.g., a turbo molecular pump, a cryo pump, etc.

Concerning the laser processing temperature (substrate temperature), the object substrate 709 and the stage 711 supporting the substrate are maintained at a temperature range of from 300 to 650° C. by using a built-in heater provided to the substrate support table 710.

In the present example, the substrate temperature is controlled to fall within a temperature range of 450±5° C. (preferably within ±2° C.). It is important to control the temperature in this range from the viewpoint of achieving uniform crystallinity. According to the study of the present inventors, it is confirmed that the crystallinity itself can be improved by controlling the temperature to fall in the range above.

The reason why a highly uniform crystallinity is obtained can be explained as follows. That is, by elevating the substrate temperature, the laser irradiation energy can include some margin. This suppresses the fluctuation in laser irradiation energy in case a laser device which becomes unstable at high output is utilized.

The temperature control is performed while feeding back the data acquired by the thermocouple 712 provided to the stage 711. The use of an atmosphere containing helium furthermore facilitates the control of the substrate temperature.

Because the optimum value of the irradiated laser light energy density differs depending on the crystallinity of the crystalline silicon film, the present inventors previously perform experiments to determine the optimal conditions.

In the present example, laser light is irradiated at an energy density of 230 $mJ/cm^2$ to crystallize the amorphous silicon film 203. The laser light is scanned at a rate of 2.4 mm/s and at a frequency of 40 Hz.

The laser light for use in the present invention is emitted from a pulse-emitting device, and a plurality of pulsed beams are superposed on each other to scan the irradiation plane (the surface of the silicon film in this case).

Figure 11:
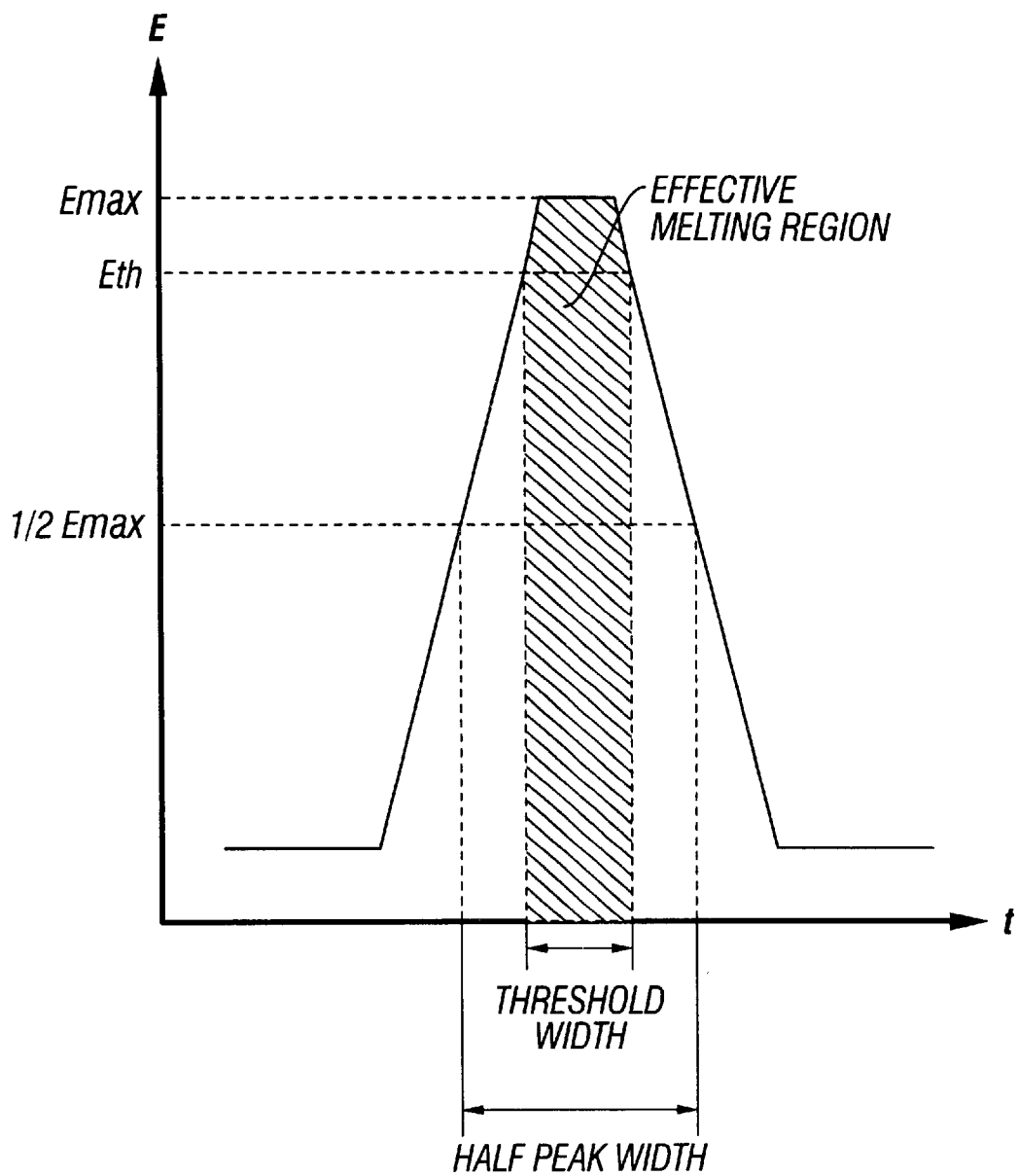
FIG. 11 is a graph showing the relation between the laser energy and the pulse width.

Referring to FIG. 11, the distribution of laser energy per pulse is described below. In FIG. 11 is shown an ideal waveform per pulse of the laser radiation, and the other waveforms are omitted. The pulse width is taken in the abscissa at units of time. The laser energy (which may expressed in terms of density) is taken in the ordinate at an arbitrary unit.

In the present invention, the most important key is to precisely control the laser energy, and this control directly influences the crystallinity of the crystalline silicon film.

The parameters which require precise control include peak value, peak width at half height, and threshold width. Referring to FIG. 11, the explanation for the parameters is given below.

Referring to FIG. 11, the peak value $E_{max}$ is the maximum value of the laser energy. An ideal waveform is shown in FIG. 11, and differs from a practical peak. More specifically, in practice, it is found a great problem that the peak value greatly fluctuates during the irradiation. Such a fluctuation in peak value is found as a fluctuation in energy density of a beam irradiated onto the irradiation surface, and it greatly influences the crystallinity.

The peak width at half height corresponds to the pulse width (where time is taken for the unit) taken at half height (expressed by $½E_{max}$ of the peak value $E_{max}$. In other words, it corresponds to the average pulse width in case of performing laser annealing for a single pulse. Thus, in general, the peak width at half height is discussed as the pulse width.

The threshold width corresponds to the pulse width (where time is taken for the unit) when the laser energy is at the threshold value (also called as a fusion threshold value, expressed herein by $E_{th}$) The threshold width is a value corresponding to about ¼ to ½ of the peak width at half height.

The threshold value (fusion threshold value) corresponds to the threshold indicating that any laser energy at this value or higher initiates the fusion of the irradiated surface (the surface of the silicon film in this case) . Accordingly, within the range of threshold width, laser light is irradiated with an energy sufficient to melt the irradiated surface.

In the present invention, the range corresponding to the threshold width as shown in FIG. 11 is denoted as the energy region effective for melting a silicon film, i.e., "an effective melting region". Thus, the most important factor in suppressing the fluctuation in laser crystallization energy is to precisely control the effective melting region.

Accordingly, in controlling the effective melting area above, it is indispensable to control the fluctuation of the peak value $E_{max}$, the peak width at half height, and the threshold width. Thus, as is proposed in the present invention, it is the key factor to control the peak value $E_{max}$, the peak width at half height, and the threshold width within a range of ±3%, preferably within a range of ±1.5% of the targeted value.

Figure 7:
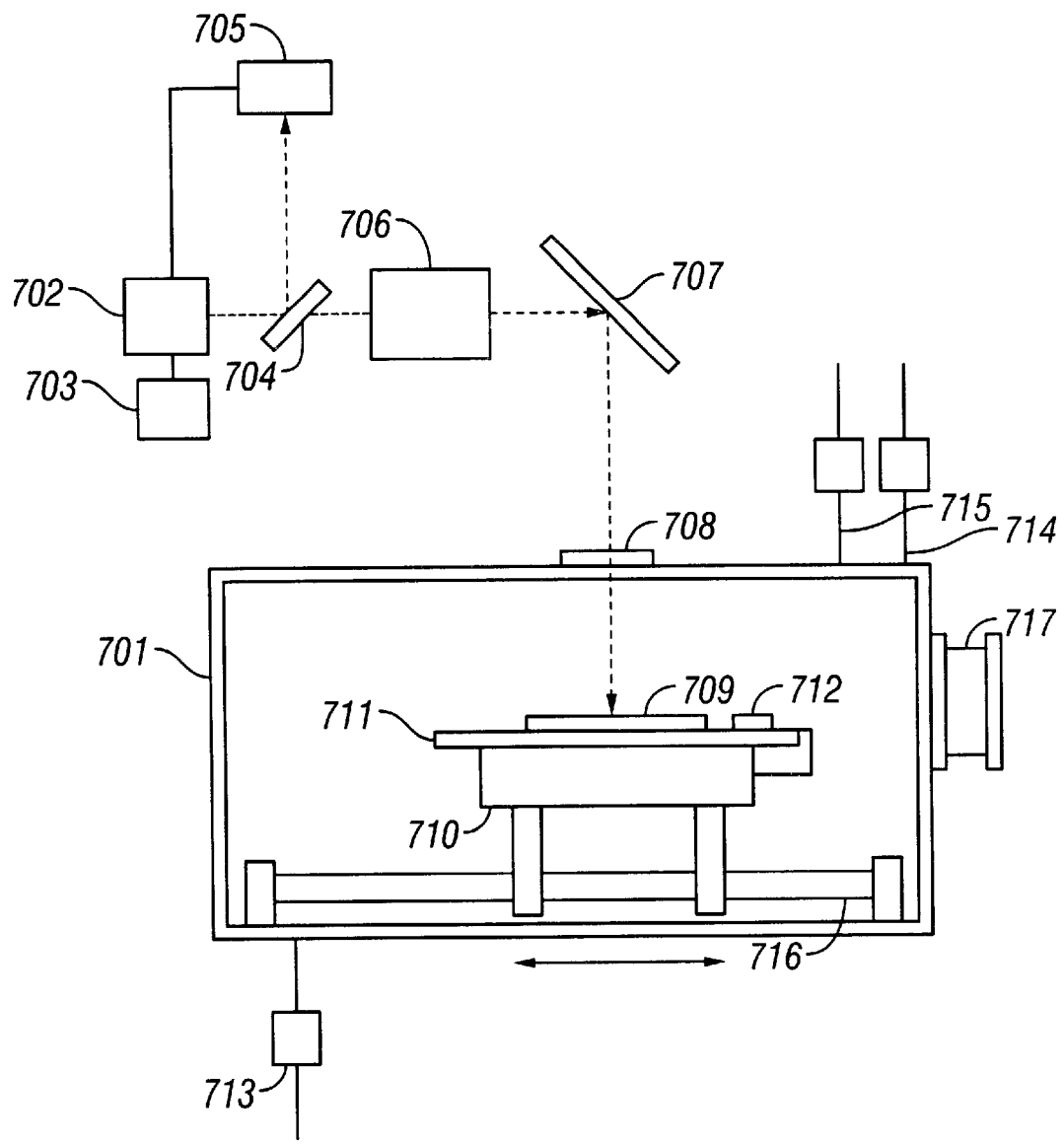
FIG. 7 shows a scheme of a laser irradiation chamber.

In the present example, with reference to FIG. 7, the fluctuation in peak value $E_{max}$ is controlled by taking out a part of the laser light emitted from the laser generator 702 by using the half mirror 704, and based on the energy detected by the control unit 705.

As described above, it is extremely effective in suppressing the fluctuation in the peak value $E_{max}$ to elevate the substrate temperature and to thereby allow a margin in the laser energy necessary for the crystallization.

Furthermore, the purity of the excitation gas (Kr, F, Xe, Cl, etc.) in the laser generator 702 shown in FIG. 7 becomes extremely important in controlling the peak width at half height and threshold width. If the purity of the excitation gas drops, the emission of laser light itself fluctuates as to affect the rise of laser pulse.

For example, gases such as Kr or F are generally diluted with an inert gas such as Ne, and then introduced inside the laser generator 702. Accordingly, to prevent fluctuation from occurring in the laser light, these gases preferably have a purity exceeding 7N.

Even in case an excitation gas with high purity is used, halides are formed during the prolonged use thereof, and this is found as the cause of impairing the purity of the gas inside the laser generator 702.

Accordingly, in the laser device for use in the present example, a gas processor 703 is connected to the laser generator 702 to maintain the high purity of the excitation gas. The gas processor 703 corresponds to a purifier which captures and removes the aforementioned halides by using an extremely low-temperature capture medium while circulating the excitation gas inside the laser generator 702.

As described in the foregoing, the use of a laser device according to the present example, whose constitution is shown in FIG. 7, enables controlling the peak value $E_{max}$, the peak width at half height, and the threshold width within a range of ±3%, preferably within a range of ±1.5% of the targeted value.

Precise control of the effective fusion region is possible by precisely controlling the peak value $E_{max}$, the peak width at half height, and the threshold width. That is, a crystalline silicon film having excellent uniformity can be obtained because laser annealing of the irradiated surface is performed under a homogeneous laser energy.

In the present example, laser annealing is applied under the precise control above on a silicon film at an arbitrary unit area by a duration of from 100 to 5,000 nsec. This period of time is necessary for achieving the required crystallinity, and was obtained experimentally by the present inventors.

However, because the present inventors regard only the duration of laser annealing in the effective fusion region as the process time, and regard the cumulative threshold width as the process time. Thus, the process time can be expressed by the threshold width $t_n$ according to the following equation 1:

$$\sum_{n=1}^{m} t_n = 100 \text{ to } 5{,}000 \text{ (nsec)} \qquad \text{[Equation 1]}$$

That is, the cumulative time duration of performing laser annealing in the effective fusion region corresponds to the process time. For instance, the peak width at half height in case of laser annealing in the present example is in a range of from 30 to 40 nsec, and the threshold width (duration of irradiating laser in the effective fusion region) is in a range of from 10 to 20 nsec.

Furthermore, because a linear laser having a lateral width of 0.9 mm is scanned at a scanning rate of 2.4 mm/s in such a manner that the irradiated region may be superposed on each other, the pulsed laser irradiation is effected for about 15 times per unit area (that is, m=15 in Equation 1 above). Accordingly, in the present example, the duration of irradiating laser in the effective fusion region is in a range of from 150 to 300 nsec.

It is also possible to appropriately control the duration of laser irradiation in the effective fusion region by increasing the irradiation time per unit area by either increasing the frequency of pulsed laser or by decreasing the scanning rate.

Figure 2B:
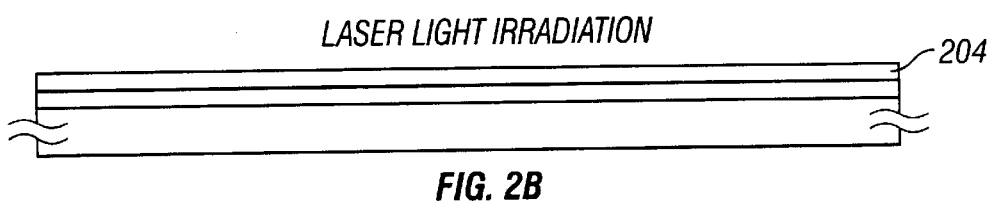

By thus performing laser annealing, a crystalline silicon film 204 as shown in FIG. 2B can be obtained. Because the crystalline silicon film 204 is formed by a precisely controlled laser annealing, the silicon film is obtained with excellent uniformity and reproducibility.

The term "excellent uniformity" as referred herein signifies that, when the silicon film is used in constructing an electro-optical device of an active matrix type, the resulting products are obtained with no uneven display or stripe patterns, or with no fluctuation in characteristics per lot.

Furthermore, because C and N elements are completely removed from the inside of the crystalline silicon film 204, their concentration in the vicinity of the interface is reduced to $2 \times 10^{19}$ cm$^{-3}$ or lower, and the concentration inside the bulk is $5 \times 10^{18}$ cm$^{-3}$ or lower.

The concentration above is obtained from the minimum value of SIMS (secondary ion mass spectroscopy) analysis. The term "bulk" as referred herein signifies the inside of the film exclusive of the region in the vicinity of the interface.

Figure 2C:
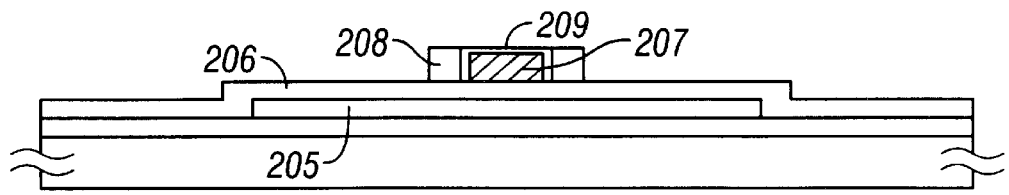

The thus obtained crystalline silicon film 204 is then patterned to form an island-like semiconductor layer 205 to provide the active layer of a thin film transistor (FIG. 2C).

In an embodiment of the present example, an active layer is formed after laser annealing is performed, but laser light may be irradiated after forming the active layer.

This case comprises annealing a minute area. Accordingly, the desired effect can be obtained at a lower laser light output. That is, the fluctuation can be further suppressed by taking a margin in laser output.

After obtaining the active layer (island-like semiconductor layer) 205, a silicon oxide film which functions as a gate insulating film 206 is formed in such a manner that it may cover the active layer 205. A 1,000-Å-thick silicon oxide film is formed as the gate insulating film 206 by means of plasma CVD, but a silicon nitride film or a silicon oxynitride film expressed by $SiO_xN_y$ may be used in the place of the silicon oxide film.

A 3,000-Å-thick aluminum film not shown in the figure is formed to construct a gate electrode 207. Scandium is added at a concentration of 0.2% by weight into the aluminum film to suppress the generation of hillocks and whiskers.

Hillocks and whiskers are needle-like or acicular protrusions attributed to the abnormal growth of aluminum. Hillocks and whiskers are not preferred because they induce short circuit between the electrodes or the wirings.

For the gate electrode 207, it is also possible to use electrically conductive materials other than aluminum.

After placing a resist mask not shown in the figure, an aluminum film also not shown is patterned by using the mask. In this manner, a pattern which provides the base for constituting the gate electrode 207 is formed. After forming the pattern for the construction of the gate electrode 207, an anodic oxide film is formed with the aforementioned resist mask (not shown) being placed.

In this case, an aqueous solution containing 3% of nitric acid is used as the electrolytic solution. The anodic oxidation step is performed by applying a current between the patterned aluminum film (not shown) functioning as the anode and a platinum cathode. In this manner, an anodic oxide film 208 is formed on the exposed surface of the patterned aluminum film.

The anodic oxide film 208 thus formed is porus. Furthermore, because a resist mask not shown in the figure is present, a porous anodic oxide film 208 is also formed on the sides of the pattern.

The porous anodic oxide film is formed at a film thickness (distance of growth) of 3,000 Å. An offset gate region can be formed depending on the film thickness of the porous anodic oxide film 208. The film thickness of the anodic oxide film 208 can be controlled by the duration of anodic oxidation.

Then, after removing the resist mask not shown, anodic oxidation is performed again. In this step, an ethylene glycol solution containing 3% of tartaric acid and neutralized by ammonia is used as the electrolytic solution.

Because the electrolytic solution intrudes into the porous anodic oxide film 208 in this step, dense anodic oxide film 209 is obtained in a state as such that the anodic oxide film 209 is in contact with the gate electrode 207.

The film thickness of the dense anodic oxide film 209 can be controlled by adjusting the applied voltage. In the present example, a 900-Å-thick anodic oxide film 209 is formed.

An offset gate region can be formed in the later step by thickly providing the dense anodic oxide film 209. In such a case, the offset gate region can be formed depending on the film thickness. In the present example, however, the contribution of the film to the formation of an offset gate region is negligible because the anodic oxide film is thin.

Thus is obtained a state illustrated in FIG. 2C. Referring to FIG. 2C, impurity ions are implanted to form source and drain regions. In this case, P (phosphorus) ions are implanted at a dose of $1 \times 10^{15}$ atoms/cm$^2$ to fabricate an N-channel type thin film transistor.

B (boron) ions are implanted for the fabrication of a P-channel type thin film transistor.

By implanting impurity ions to the structure illustrated in FIG. 2C, impurity ions are implanted into regions 210 and 211. No impurity ions are implanted into the regions 212 and 213. Because no voltage is applied to the regions 212 and 213 by the gate electrode 207, these regions function as offset gate regions and not as channel forming regions.

Figure 2D:
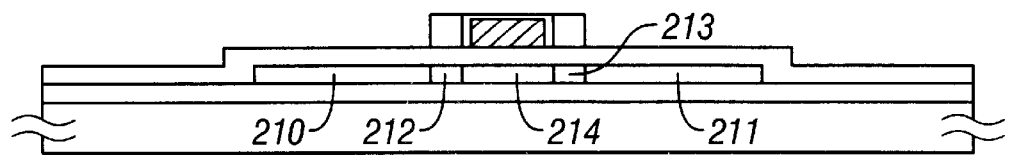

The region 214 functions as a channel forming region. Thus is obtained a state as shown in FIG. 2D.

Upon completion of the implantation of impurity ions, laser light is irradiated in order to activate the region doped with the impurity ions and to anneal the region damaged by the ion bombardment (hereinafter, this step is referred to as a "laser activation step").

Similar to the laser crystallization step, the laser activation step can be performed to achieve an annealing effect with high uniformity by applying a similar precise control using the same device as that used in the laser crystallization. In this step, however, the heating temperature for the object substrate must be determined by taking the heat resistance of the aluminum gate electrode 207 into consideration.

Accordingly, in the present example, the laser activation step is carried out while heating the substrate temperature to 200° C. If a material having high heat resistance is used for the gate electrode 207, as a matter of course, the temperature of the substrate may be elevated in accordance with the heat resistance.

The conditions of laser irradiation in the laser activation step change depending on the crystallinity of the active layer 205 as well as on the quantity of implanted impurity ions. Accordingly, optimum conditions must be determined previously by repeatedly conducting experiments. In the present example, laser irradiation is effected at an energy density of 160 mJ/cm$^2$.

After obtaining a state illustrated in FIG. 2D, a silicon nitride film or a silicon oxide film is formed to provide an interlayer insulating film 215. A multilayered film of a silicon nitride film and a silicon oxide film may be used for the interlayer insulating film 215. Otherwise, a multilayered film of silicon nitride film and a resin film can be used as well.

Figure 2E:
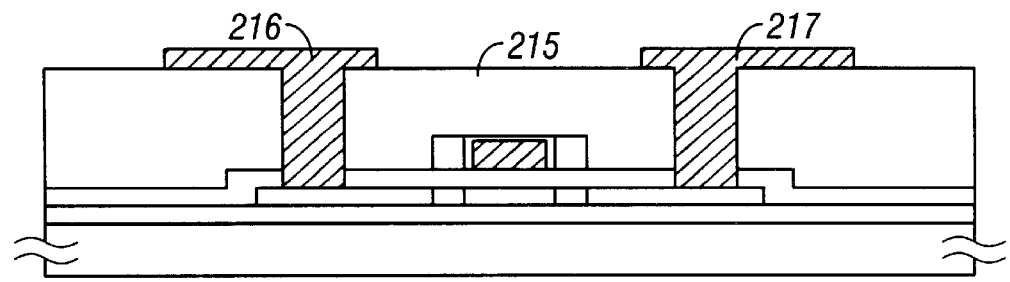

After forming an interlayer insulating film 215, contact holes are provided therein. Then, a source electrode 216 and a drain electrode 217 are formed. Thus is completed a thin film transistor as shown in FIG. 2E.

The thin film transistor thus fabricated comprises a highly uniform active layer for the key portion thereof. Accordingly, a high performance thin film transistor capable of stable operation can be implemented.

The N-channel thin film transistor thus fabricated exhibits favorable electric characteristics which yield a threshold value of about 1.5 V and an ON current in a range of from 10 to 15 $\mu$A under drive conditions with a drain voltage Vd of 14 V and a gate voltage Vg of 10 V.

EXAMPLE 2

The present example refers to a case of crystallizing the amorphous silicon film, which is referred in example 1, by means of heat treatment. In the present example, furthermore, a metallic element is used for the acceleration of crystallization. As a matter of course, the crystallization may be effected without using a metallic element.

Thus, an object of the present example is to further improve, by applying laser annealing, the crystallinity of the crystalline silicon film formed by heat treatment.

Since the process steps other than the crystallization are the same as the constitution described in example 1, the description in the present example is restricted only to the points differing from those described in example 1 with reference to FIG. 3.

First, a 2,000-Å-thick silicon oxide film is formed by sputtering or plasma CVD as a base film 302 on a substrate 301.

Then, an amorphous silicon film 303 is formed to a thickness of from 200 to 500 Å by means of plasma CVD or low pressure thermal CVD. Similar to example 1, the amorphous silicon film 303 is formed in such a manner that the fluctuation in film thickness on the surface of the substrate is constrained to distribute within ±5%, preferably, ±2.5% of the targeted value.

Figure 3A:
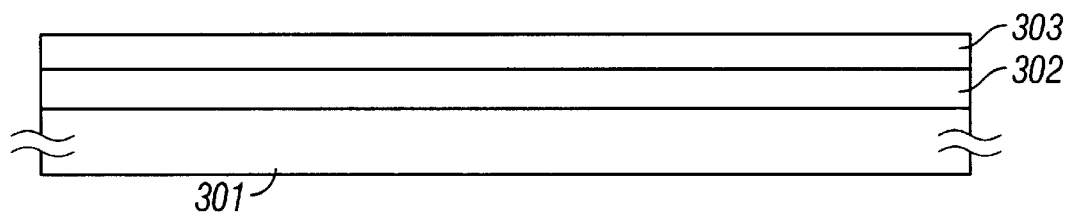
FIGS. 3A to 3D show the process steps in forming a crystalline silicon film.

After forming the amorphous silicon film 303, an UV light is irradiated thereto under an oxygen atmosphere to form a very thin oxide film (not shown) on the surface of the amorphous silicon film 303. The oxide film improves the wettability of the surface to a solution that is applied thereon on the later step of introducing a metallic element by means of solution coating (FIG. 3A).

Then, a metallic element is introduced to accelerate the crystallization of the amorphous silicon film 303. The details of this technique is disclosed in JP-A-Hei 6-232059 and JP-A-Hei 7-321339 (the term "JP-A-" as referred herein signifies "an unexamined published Japanese patent application") filed by the present inventors.

In the present example, Ni (nickel) is used as the metallic element which accelerates the crystallization. In addition to Ni, usable metallic elements include Fe, Co, Cu, Pd, Pt, and Au.

Figure 3B:
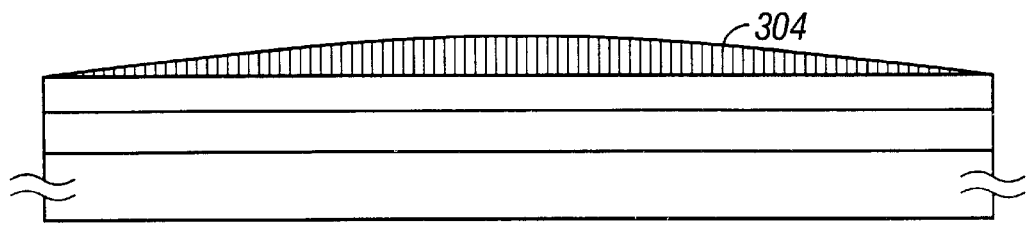

In the present example, a nickel acetate solution is used to introduce metallic Ni. More specifically, a nickel acetate solution prepared at a predetermined Ni concentration (10 ppm by weight in the present case) is applied dropwise to the amorphous silicon film 303. In this manner, a state comprising an aqueous film 304 is realized (FIG. 3B).

The solution applied in excess is blown away by means of spin drying using a spin coater (not shown). Thus, an ultrathin nickel layer is formed on the oxide film (not shown) formed on the amorphous silicon film 303 by this solution-coating process.

Figure 3C:
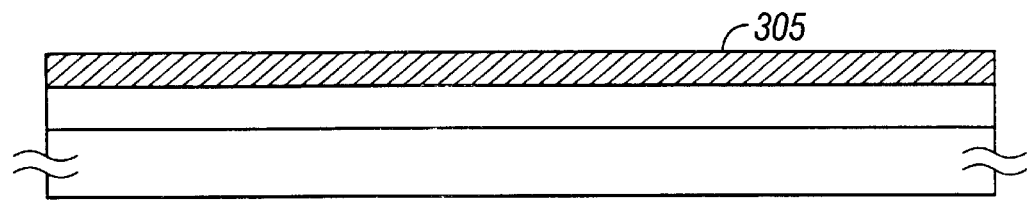

A crystalline silicon film 305 is then obtained by performing heat treatment at a temperature in a range of from 500 to 700° C., representatively, at 600° C., for a duration of 4 hours in an inert atmosphere or in an inert atmosphere containing gaseous hydrogen (FIG. 3C).

It is important to control the temperature during the heat treatment to fall within a range of ±5° C., preferably within ±2° C., of the targeted temperature, because the intergranular crystallinity of the crystalline silicon film depends on this crystallization step effected by the present heat treatment.

Similar to example 1, it is necessary to precisely control the temperature by monitoring the substrate temperature using a temperature-detecting element, such as a thermocouple, provided to the susceptor which supports the substrate.

Once the crystalline silicon film 305 is obtained, laser light is irradiated to improve the crystallinity. Similar to the laser crystallization process described in example 1, the laser annealing must be conducted under strictly controlled conditions. Furthermore, as was the case in example 1, a laser device whose constitution is shown in FIG. 7 is used in this process.

The laser annealing step comprises irradiating an ultraviolet-emitting laser to the crystalline silicon film. In this manner, the crystalline silicon film is once molten, and then recrystallized to improve the crystallinity.

Figure 3D:
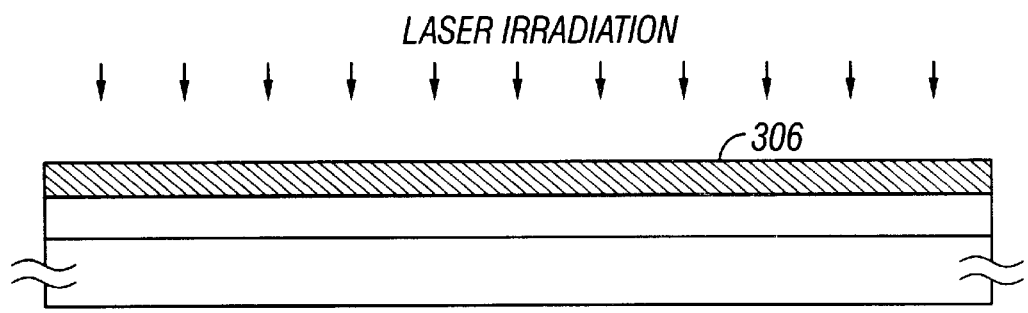

As compared with an amorphous silicon film, a crystalline silicon film less absorbs light in the ultraviolet wavelength region. Accordingly, laser light for use in the laser annealing step must be irradiated with a higher energy. Furthermore, the laser energy must be higher for a crystalline silicon film having higher crystallinity. Thus, the laser energy must be determined experimentally in advance. In the present example, laser is irradiated at an energy density of 260 mJ/cm$^2$ (FIG. 3D).

Thus is obtained a crystalline silicon film 306 whose crystallinity is considerably improved. Similar to the case in example 1, the crystalline silicon film 306 thus obtained yields excellent uniformity with high reproducibility.

EXAMPLE 3

The present example refers to a case of fabricating a thin film transistor comprising an LDD (lightly doped drain) region by means of a process described in example 1, but which is further ameliorated.

First, the same process steps as those described in example 1 are followed to obtain an impurity-implanted state shown in FIG. 2D.

Then, the porous anodic oxide film 208 is removed, and the impurity ions are implanted again. The implantation of impurity ions is effected in the same manner and by using the same impurity ions as in the step of forming the source region 210 and the drain region 211, except for lowering the dose.

As a result, impurity ions (for instance, P ions) are implanted into regions 212 and 213 at a density lower than that in the source and drain regions. In this manner, low density impurity regions are formed in regions 212 and 213. The low density impurity region 213 on the drain region side 211 becomes the region generally known as LDD (lightly doped drain) region.

Then, once the impurity implanted regions are formed, a laser activation step similar to that in example 1 is performed. According to the study of the present inventors, however, it is known that the low density impurity regions (particularly the LDD regions) are apt to reflect the influence of the fluctuation in laser energy.

Accordingly, the application of laser annealing under precise control in accordance with the present invention is a particularly effective means in fabricating a low density impurity region having excellent uniformity, as well as in fabricating a thin film transistor having uniform electric properties.

A complete thin film transistor is then obtained by performing the step illustrated in FIG. 2E.

The LDD region has the functions similar to that of an offset gate region. That is, it relaxes the intense electric field between the channel forming region and the drain region, and decreases the leak current during the OFF operation. Furthermore, in case of an N-channel type thin film transistor, it suppresses the generation of hot carriers; hence, it prevents the problem of degradation from occurring due to the presence of hot carriers.

EXAMPLE 4

The present example refers to a case in which an active matrix liquid crystal display device is constructed by using a thin film transistor (TFT) fabricated in accordance with the present invention. The fabrication process for the pixel TFTs provided in the pixel region and the circuit TFTs provided in the peripheral drive circuit is described briefly below with reference to FIGS. 4A to 4E.

It should be noted that, however, the description concerning the control on fluctuation and the like of the parameters in the process steps is omitted, because it is already described in example 1. In the description below, the process steps for fabricating circuit TFTs and pixel TFTs are referred by taking it for granted that the basic process is the same as the constitution explained in example 1.

First, a glass substrate 401, representatively Corning 7059 and the like, is prepared. As a matter of course, a quartz substrate or a semiconductor material having an insulating surface can be used. Then, a silicon oxide film is formed at a thickness of 2,000 Å to provide an underlying film 402. The underlying film 402 can be formed by means of sputtering or plasma CVD.

A 100 to 1,000-Å-thick amorphous silicon film (not shown) is formed thereon by means of plasma CVD or low pressure thermal CVD. In the present example, a 500-Å-thick film is formed by low pressure thermal CVD.

Then, the amorphous silicon film not shown in the figure is crystallized by means of a proper crystallization method. The crystallization can be performed by a heat treatment in a temperature range of from 550 to 650° C. for a duration of 1 to 24 hours, or by irradiating laser at a wavelength of 248, 265, or 308 nm. The both methods can be used simultaneously, or an element (such as Ni) which accelerates the crystallization may be added.

Then, the crystalline silicon film thus obtained by crystallizing the amorphous silicon film is patterned to form island-like semiconductor layers as active layers 403 and 404.

A silicon oxynitride film 405 expressed by SiO$_x$N$_y$ is formed to a thickness of 1,200 Å by plasma CVD. In the later steps, the silicon oxynitride film 405 functions as a gate insulating film. A silicon oxide film or a silicon nitride film can be used in the place of the silicon oxynitride film.

Then, a 4,000-Å-thick aluminum film 406 is formed by means of DC sputtering. Scandium is added at a concentration of 0.2% by weight into the aluminum film to suppress the generation of hillocks and whiskers. The aluminum film 406 thus formed functions in the later steps to provide a gate electrode.

A film of other metallic materials, such as Mo, Ti, Ta, Cr, etc., may be used in the place of the aluminum film. Otherwise, a conductive film, such as of polysilicon or silicide materials, can be used as well.

Then, anodic oxidation is performed in an electrolytic solution using the aluminum film 406 as an anode. An ethylene glycol solution containing 3% of tartaric acid neutralized by aqueous ammonia to adjust the pH value thereof to 6.92 may be used for the electrolytic solution. This process is effected by using platinum as a cathode and by applying a chemical conversion current of 5 mA at a final voltage of 10 V.

Figure 4A:
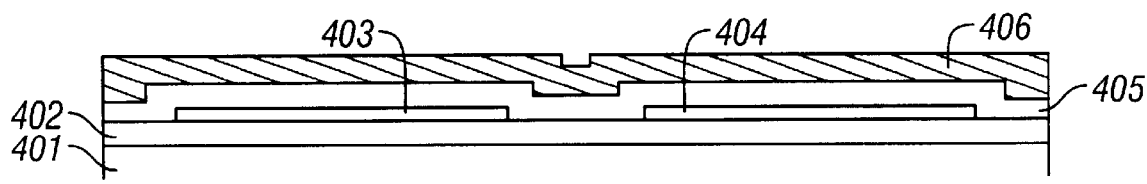
FIGS. 4A to 4E show the process steps in fabricating another thin film transistor.

The thus obtained not shown dense anodic oxide film is effective to later improve the adhesiveness to the photoresist. Furthermore, the film thickness can be controlled by changing the duration of applied voltage (FIG. 4A).

Figure 4B:
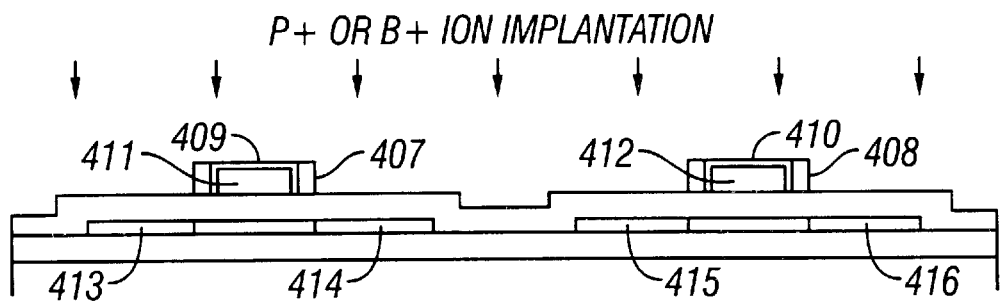

Then, after thus obtaining the state shown in FIG. 4A, the aluminum film 406 is patterned to form the prototype for the gate electrode that is formed in a later step. Then, a second anodic oxidation is performed to form anodic oxide films 407 and 408 (FIG. 4B).

The second anodic oxidation is effected in an aqueous 3% oxalic acid provided as the electrolytic solution, and by using a platinum cathode under a chemical conversion current of from 2 to 3 mA and at a final voltage of 8 V.

In this step, the anodic oxidation proceeds in a direction parallel to the base. Furthermore, the length of the porous anodic oxide films 407 and 408 is controlled by changing the duration of applied voltage.

Then, after removing the photoresist by using a proper stripping solution, a third anodic oxidation is performed. An ethylene glycol solution containing 3% of tartaric acid neutralized by aqueous ammonia to adjust the pH value thereof to 6.92 may be used for the electrolytic solution. This process is effected by using platinum as the cathode and by applying a chemical conversion current of 5 to 6 mA at a final voltage of 100 V.

The anodic oxide films 409 and 410 thus obtained are extremely dense and strong. Accordingly, they are effective for protecting the gate electrodes 411 and 412 from being damaged in the later steps such as the doping step. However, because the strong anodic oxide films 409 and 410 are sparingly etched, it tends that a longer etching time duration is taken in forming contact holes. Thus, the anodic oxide films are preferably formed at a thickness of 1,000 Å or less.

After obtaining a state as is shown in FIG. 4B, impurities are implanted into active layers 403 and 404 by means of ion doping. In case of fabricating an N-channel TFT, for instance, P (phosphorus) is implanted, whereas B (boron) is implanted as an impurity in case of fabricating a P-channel TFT.

Thus, source/drain regions 413 and 414 for the circuit TFT as well as source/drain regions 415 and 416 for the pixel TFT are formed in a self-aligned manner.

Then, ion implantation is performed again after removing the porous anodic oxide films 407 and 408. In this case, ions are implanted at a dose lower than that at the previous ion implantation.

Low density impurity regions 417 and 418 for the circuit TFT, a channel forming region 421, low density impurity regions 419 and 420 for the pixel TFT, and a channel forming region 422 are formed in a self-aligned manner.

Figure 4C:
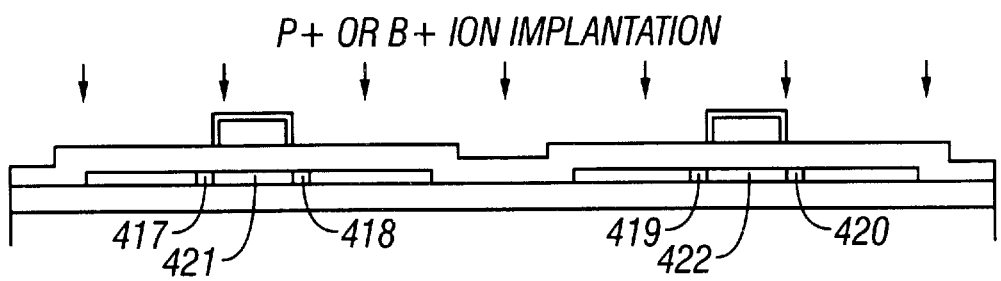

Once a state illustrated in FIG. 4C is obtained, KrF laser is irradiated and thermal annealing is performed. In the present example, laser light is applied at an energy density of from 160 to 170 mJ/cm$^2$, and thermal annealing is effected at a temperature in a range of from 300 to 450° C. for a duration of 1 hour. The crystallinity of the active layers 403 and 404, which were damaged in the ion doping step, can be improved by performing this step.

Figure 4D:
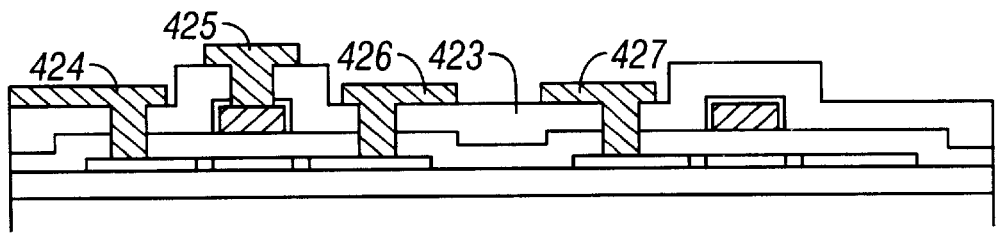

A silicon nitride film (which may be replaced by a silicon oxide film) is formed by means of plasma CVD at a thickness of from 3,000 to 5,000 Å to provide a first interlayer insulating film 423. The interlayer insulating film 423 may have a multilayered structure (FIG. 4D).

After the first interlayer insulating film 423 is formed, the interlayer insulating film provided on the source region 413, the gate electrode 411, and the drain region 414 of the circuit TFT, as well as the source region 415 of the pixel TFT is etched to form contact holes.

Then, a source electrode 424, a gate electrode 425, and a drain electrode 426 for the circuit TFT as well as the source electrode 427 for the pixel TFT are formed by using a layered film of titanium and a material containing aluminum as a principal component.

Figure 4E:
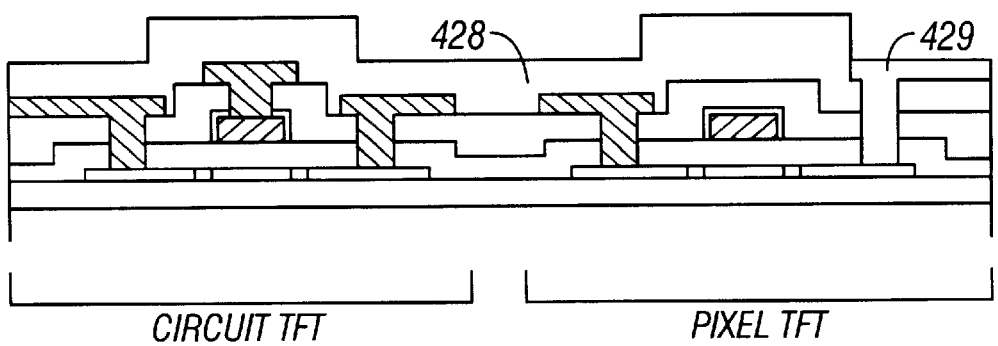

Then, a silicon nitride film (which may be replaced by a silicon oxide film) is formed by means of plasma CVD at a thickness of from 3,000 to 5,000 Å to provide a second interlayer insulating film 428. The interlayer insulating film 428 may have a multilayered structure (FIG. 4E).

After forming the second interlayer insulating film 428, the interlayer insulating films 428 and 423 provided on the drain region 416 of the pixel TFT are etched to form contact holes, and to thereby form a pixel electrode 429 comprising a transparent electrically conductive film. In this manner, a circuit TFT and a pixel TFT are formed as illustrated in FIG. 4E.

Figure 5:
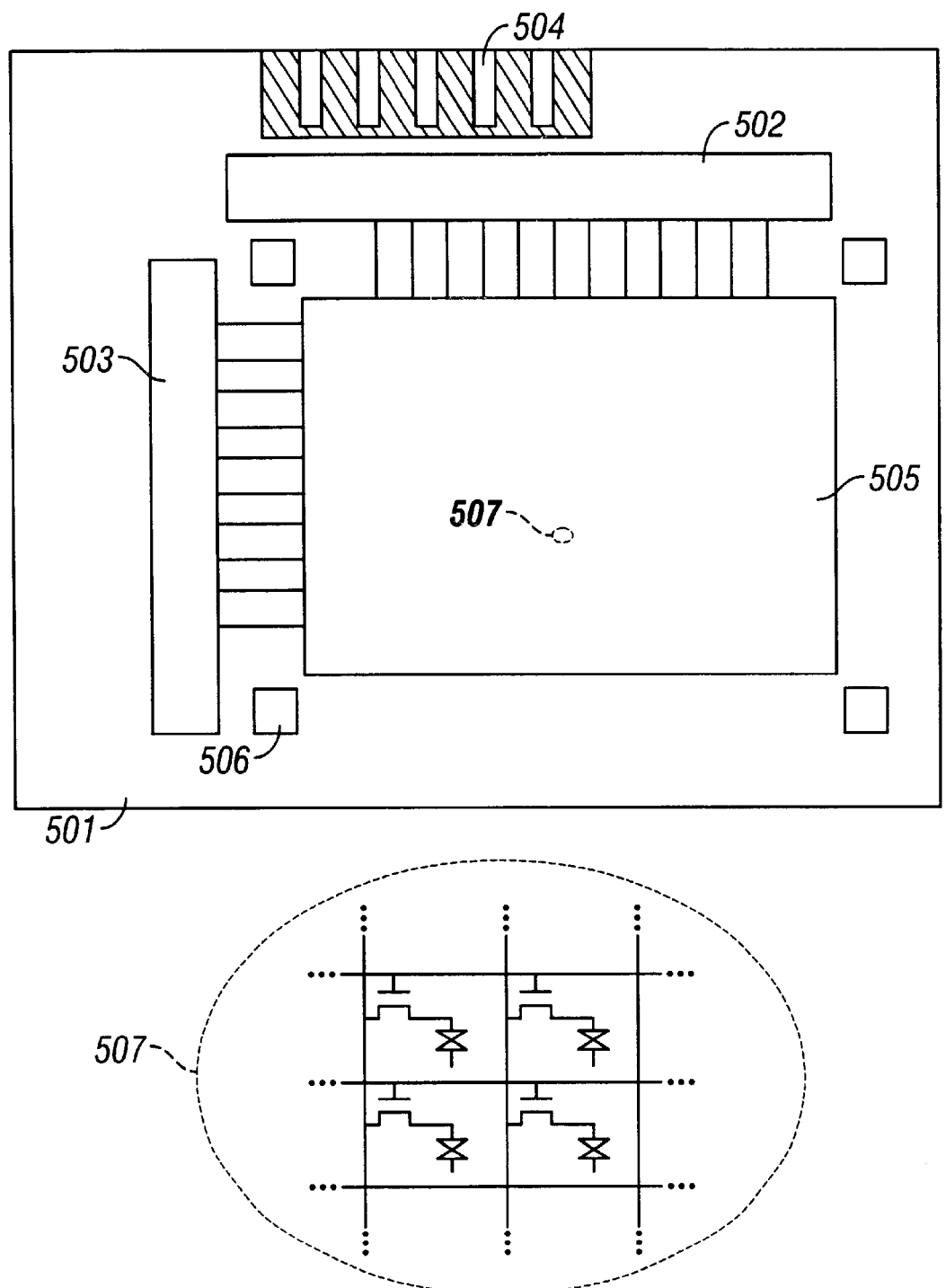
FIG. 5 is a scheme of an active matrix liquid crystal display device.

A scheme of the active matrix liquid crystal display device comprising the circuit TFT and the pixel TFT described above is provided in FIG. 5. Referring to FIG. 5, horizontal scanning circuit 502 and a vertical scanning circuit 503 are provided on a glass substrate 501.

An external image signal is taken through an input terminal 504, and is sent to a pixel electrode by using a pixel TFT controlled by the horizontal and the vertical scanning circuits 502 and 503 as a switching element. Then, images are displayed in the pixel region 505 by changing the electro-optical properties of the liquid crystal being interposed between the pixel electrode and the opposing substrate. A common electrode 506 for applying a predetermined voltage to the opposing substrate is also provided.

Thus, a circuit TFT as shown in the aforementioned FIGS. 4A to 4E can constitute the horizontal and the vertical scanning circuits 502 and 503 in a CMOS structure in which N-channel type and P-channel type are combined in a complementary structure.

As shown in the enlarged FIG. 507 for the pixel region 505, the pixel TFTs can be placed on each of the cross points of the gate and source lines provided in a matrix-like arrangement. In this manner, they can be used as switching elements controlling the quantity of charge input and output into the pixel electrode.

The device shown in FIG. 5 displays the image in a manner described schematically above, and is a compact and high performance panel comprising a peripheral circuit operating at an operation frequency of 3 MHz or higher and yielding a contrast ratio of 100 or higher at the display portion.

The active matrix liquid crystal display device described in the present example comprises circuit TFTs and pixel TFTs having an active layer which exhibits crystallinity with excellent uniformity and reproducibility. Accordingly, all the thin film transistors yield uniform characteristics.

In particular, because the pixel TFTs with uniform characteristics are used, no lateral stripe patterns generate in displaying an image. Accordingly, the constitution of the present example is industrially highly advantageous.

EXAMPLE 5

The constitutions described in the foregoing examples 1 to 4 comprise planar type thin film transistors, but the active layer according to the present invention can be applied not only to the planar type, but also to all types of thin film transistors.

Accordingly, the present example refers to a case of fabricating, for instance, a reverse stagger type thin film transistor. Such a type of thin film transistor can be formed in accordance with the technique disclosed in JP-A-Hei5-275452 or JP-A-Hei 7-99317. Thus, the details of the conditions, thickness of the films, etc., may be referred to the publication above.

In addition, although not explained in particular, the factors influencing laser annealing are controlled in a manner similar to that described in example 1.

Figure 6A:
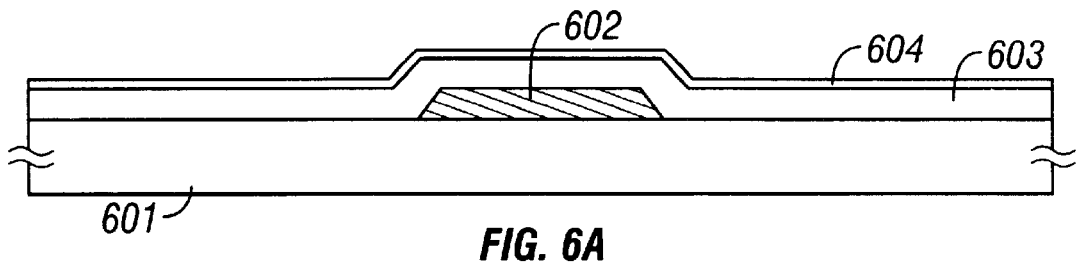
FIGS. 6A to 6D show the process steps in fabricating a still other thin film transistor.

Referring to FIG. 6A, a gate electrode 602 made of an electrically conductive material is formed on a substrate 601 having an insulating surface. Considering the later crystallization of the silicon film, the gate electrode 602 is preferably made of a material having a high thermal resistance.

Furthermore, to improve withstand voltage, an anodic oxide film may be formed on the surface and the sides of the gate electrode 602 by means of a known technique, i.e., anodic oxidation. It is also possible to implement a constitution comprising an LDD region or an HRD region by utilizing the anodic oxide film thus obtained by the anodic oxidation process above. For the details of this technique, reference can be made to JP-A-7-169974 filed by the present inventors.

Then, a silicon oxide film which functions as the gate insulating film 603 is formed by means of plasma CVD, and an amorphous silicon film (not shown) is formed thereon by low pressure thermal CVD. The amorphous silicon film not shown is then crystallized by the means described in example 1 to provide a crystalline silicon film 604 which constitutes an active layer (FIG. 6A).

The thus obtained crystalline silicon film 604 is patterned to form an island-like semiconductor layer which constitutes the active layer 605.

A silicon nitride film (not shown) is formed thereafter to cover the active layer 605. Then, a resist mask (not shown) is provided on the silicon nitride film, and is patterned by back surface exposure to selectively remove the silicon nitride film by etching.

The island-like pattern 606 made of silicon nitride film thus obtained functions as a masking material in the later step of ion implantation.

Figure 6B:
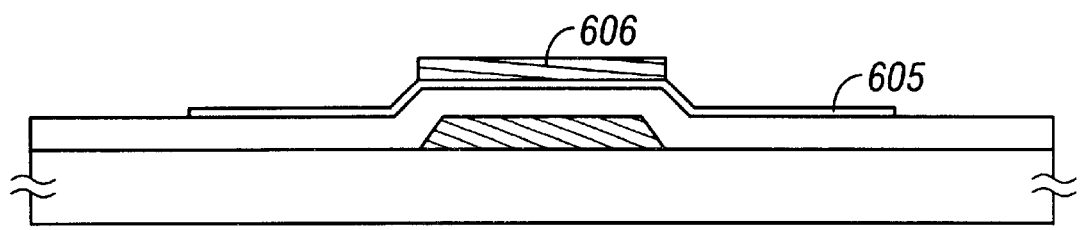

Thus is obtained a state illustrated in FIG. 6B. Then, impurity ions which render the exposed active layer 605 monoconductive (one-conductive) are implanted. This step can be performed by following a known ion implantation method. After the ion implantation, the impurity ions are activated by laser annealing and the like. As a matter of course, the laser annealing is effected in accordance with the present invention.

Thus, a source region 607 and a drain region 608 are formed in the active layer 605. The region which was not implanted with ions due to the presence of the island-like pattern 606 becomes a channel-forming region 609 (FIG. 6C).

Figure 6C:
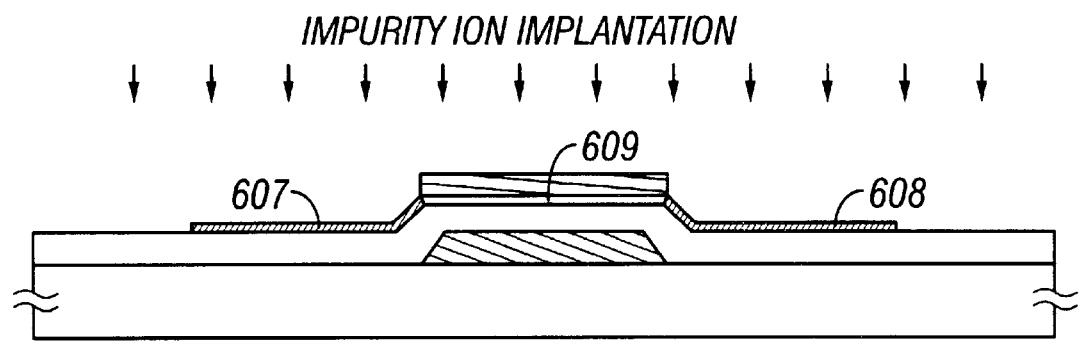

Once the state illustrated in FIG. 6C is obtained, a silicon oxide film 610 is formed as an interlayer insulating film by means of plasma CVD. Furthermore, contact holes which reach the source region 607 and the drain region 608 are formed.

Figure 6D:
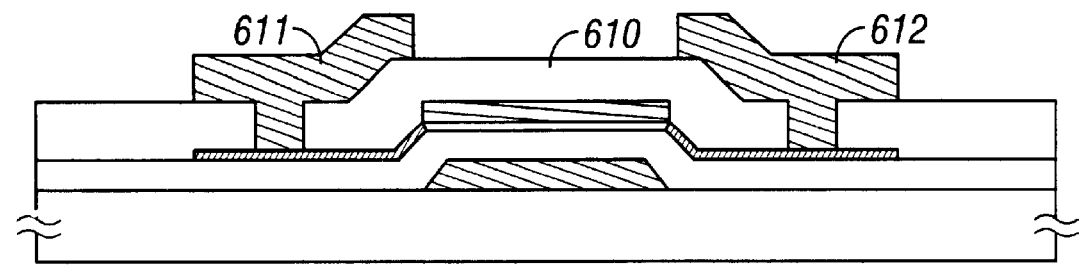

Thus, by forming a source electrode 611 and a drain electrode 612 comprising an electrically conductive material, a reverse stagger type thin film transistor as shown in FIG. 6D is completed.

As is described above, the present invention can be sufficiently applied to a reverse stagger type thin film transistor. Because the reverse stagger type thin film transistor comprises a gate electrode 602 being placed on the lower side of the active layer 605, the entire active layer 605 can be advantageously subjected to a uniform treatment without being shielded by the gate electrode 602 in case the activation of impurity ions and the like is performed by laser annealing.

Furthermore, because of the structural advantages, a highly reliable thin film transistor free from contamination from the substrate 601 can be implemented.

EXAMPLE 6

The material for use in the gate electrodes and the gate lines of the thin film transistors described in examples 1 to 5 above is not only limited to an aluminum film.

Other electrically conductive materials, such as Mo, Ti, Ta, Cr, W, etc., can be used for the gate electrode. Furthermore, it is possible to use a crystalline silicon film rendered monoconductive (one-conductive) as the gate electrode.

In particular, the use of a crystalline silicon film as the gate electrode is advantageous in that the temperature range for use in the heat treatment in the fabrication process can be taken with increased margin, because the heat resistance of the crystalline silicon film is well comparable to that of the active layer.

In case of forming a crystalline silicon film which constitutes the active layer in a reverse stagger structure, or in improving the crystallinity of the crystalline silicon film, for instance, a gate electrode with higher thermal resistance is preferred because it can be used without fear of causing diffusion of the gate electrode material, etc.

EXAMPLE 7

The thin film transistors described in examples 1 to 6 above are formed not only on an insulating surface, but also on an electrically conductive film or on an interlayer insulating film formed on a semiconductor device.

For instance, an integrated circuit having a three-dimensional structure which constitutes a thin film transistor according to the present invention can be formed on an integrated circuit, i.e., an IC formed on a silicon substrate.

An integrated circuit having the three-dimensional structure above is advantageous in that a large scale integrated circuit is constructed while minimizing the dominating area (occupying area), because the semiconductor device is constructed three-dimensionally. This point is of great importance in minimizing device size.

EXAMPLE 8

In the present example, described is a case of, in performing laser irradiation, applying auxiliary heating to the region just in front and just at the back of the object region to be scanned by a laser light.

Figure 9:
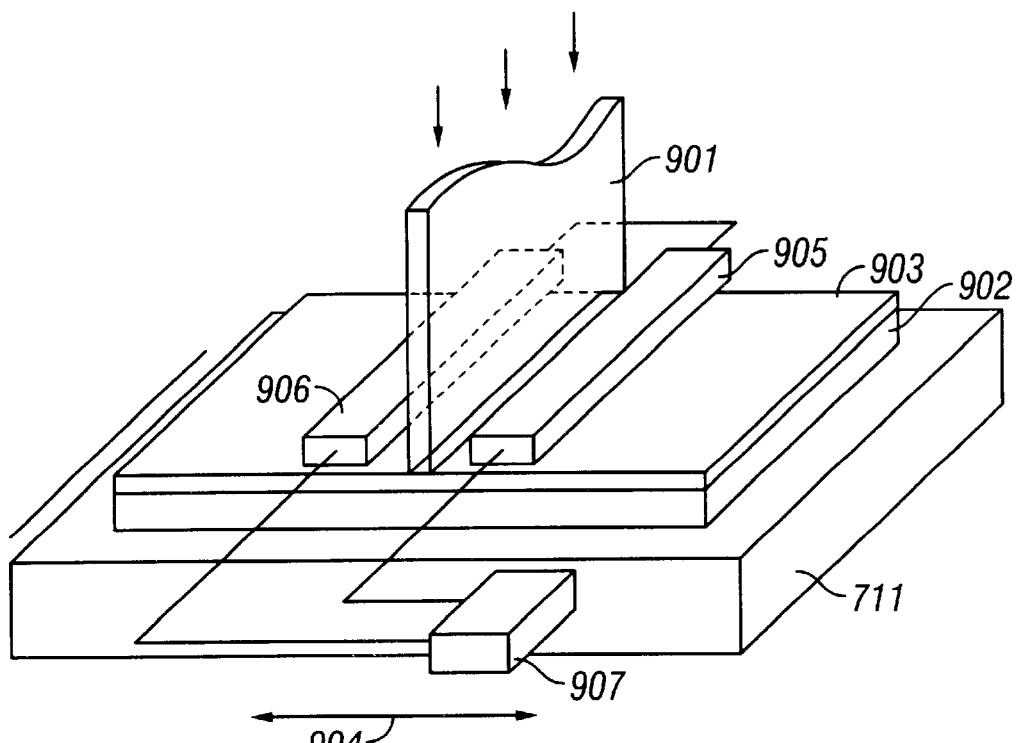
FIG. 9 shows a scheme of a part of a laser device.

FIG. 9 shows a schematically drawn laser device illustrated in FIG. 7, in which the observation point is concentrated to a part. Thus, the symbols used in FIG. 9 stand for the same portions as those shown in FIG. 7, except for the differing portions.

The irradiated laser 901 processed into a linear beam by the optical system and incident to the substrate is irradiated to an amorphous silicon film 903 formed on a substrate 902 having an edged surface in a direction approximately perpendicular to the substrate.

The laser light 901 is irradiated to the entire surface of the amorphous silicon film 903 by moving the stage 711 in a direction shown by an arrow 904. This method is extremely useful, because a high productivity can be achieved.

The constitution of the present example differs from that described in example 1 in that, in irradiating a laser 901 to a particular region (a linear region), the region just in front of the object region (which is also provided in a linear or a rectangular form) and the region just at the back of the object region (which is also provided in a linear or a rectangular form) are heated by auxiliary heating devices 905 and 906.

The auxiliary heating devices 905 and 906 radiates heat by the electric current supplied by a power source 907 and thereby generating Joule's heat. The auxiliary heating devices 905 and 906 must be provided as close as possible to the object region that is irradiated by the laser 901.

Electric current is supplied to the auxiliary heating devices 905 and 906 in such a manner to heat the amorphous silicon film to a predetermined temperature. This temperature must be set as high as possible, but by taking the heat resistance of the substrate 902 into consideration. According to the knowledge of the present inventors, in case of using a glass substrate, for instance, this temperature is set as high as possible but not higher than the deformation temperature of the glass substrate.

Furthermore, in this case, the temperature for heating the amorphous silicon film 903 by means of the auxiliary heating devices 905 and 906 is set to be higher by 50 to 100° C. than the heating temperature of the heater built-in the substrate support table 710 provided to the lower portion of the stage.

Furthermore, in this constitution, the auxiliary heating devices 905 and 906 are equipped with thermocouples and the like to perform precise temperature control, so that the fluctuation in temperature distribution may fall within ±3° C. (preferably ±1° C.) of the standard value. Because the temperature control casts considerable influence on the process of crystallization, this must be effected with great care.

When laser light 901 is irradiated, the region of the amorphous silicon film 903 irradiated by the laser light 901 is molten instantaneously, but because the region surrounding the irradiated region is also heated by the auxiliary heating devices 905 and 906, a longer time duration can be taken for the solidification after irradiating the laser light 901.

Thus, because the irradiation of the laser light 901 is gradually effected while scanning, and therefore an abrupt phase change can be prevented from occurring, the stress inside the film can be relaxed. This enables formation of a highly uniform crystalline silicon film on the surface of the substrate.

EXAMPLE 9

Figure 10:
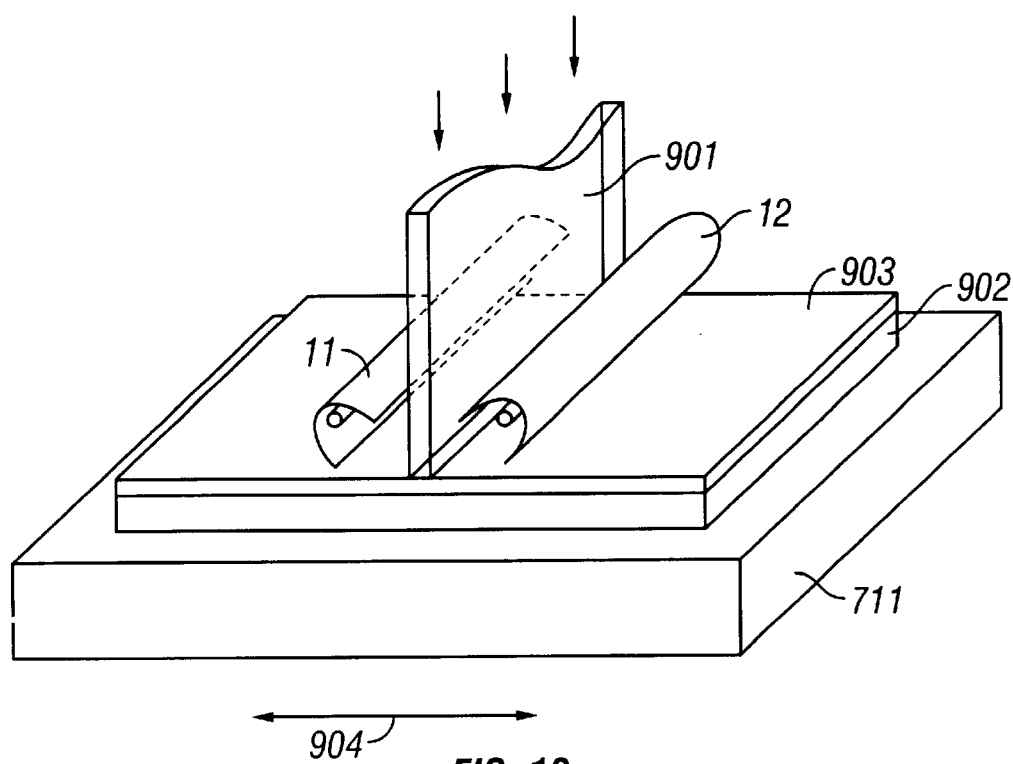
FIG. 10 shows a scheme of a part of another laser device.

The present example refers to a case in which the auxiliary heating devices 905 and 906 described in the constitution of example 8 are provided by means of lamp heating using infrared radiation. FIG. 10 shows schematically the laser irradiation device for use in the present example. Because the basic constitution is the same as that illustrated in FIG. 9, the same symbols are used for the description.

In the present example, an infrared ray is irradiated from halogen lamps 11 and 12 to the regions in front and at the back of the region that is irradiated by scanning laser light 901. Because infrared ray is hardly absorbed by a glass substrate, while is readily absorbed by a silicon film, the silicon film (amorphous silicon film 903 in this case) can be heated selectively.

The heating method using the infrared-ray-emitting lamps enables heating the amorphous silicon film 903 alone to a temperature of about 1,000° C. (surface temperature) even in case a glass substrate having a relatively low heat resistance is used as the substrate 902.

However, since peeling off or cracks generate due to the difference in thermal expansion coefficient between the glass substrate and the silicon film, optimum heating conditions must be obtained experimentally. In general, heating using infrared-ray-emitting lamps 11 and 12 is performed in such a manner that a surface temperature in a range of from 700 to 900° C. is achieved on the amorphous silicon film 903.

Similar to the constitution described in example 7, an abrupt phase change can be prevented from occurring by using the constitution of the present example. Thus, the stress inside the film can be relaxed, and this enables the formation of a highly uniform crystalline silicon film on the surface of the substrate.

EXAMPLE 10

The present example refers to a constitution similar to that described in example 1, except for using lamp annealing as a means of heating the object substrate 709 in irradiating laser.

That is, referring to FIG. 7, a light source emitting an intense light is provided inside the substrate support table 710 in the place of the built-in heater, and the object substrate 709 is heated by the thus irradiated intense light.

As the light source above, usable are lamp light sources emitting infrared or ultraviolet rays. This heating means using light irradiation from lamps is highly effective in that the temperature is elevated and lowered at a high rate and a highly uniform annealing effect is obtained.

The fact that the temperature is increased and decreased at a high speed also signifies a considerable increase in throughput. Accordingly, this is also very effective from the viewpoint of productivity.

However, in case of irradiating infrared ray by using a lamp, it is necessary to use a stage 711 made of a glass covered by an SiC or Si coating, or such made of a quartz substrate, which readily absorbs infrared ray.

Furthermore, as a matter of course, the substrate temperature must be monitored by providing a thermocouple and the like to the stage 711, and the measured results are fed back to control the intensity of the intense light radiated from the lamp light source.

As described above, by employing a constitution as such to control the substrate temperature by using lamp annealing, which is superior in controllability and uniformity, a laser annealing process further improved in uniformity and reproducibility can be implemented.

EXAMPLE 11

Figure 12:
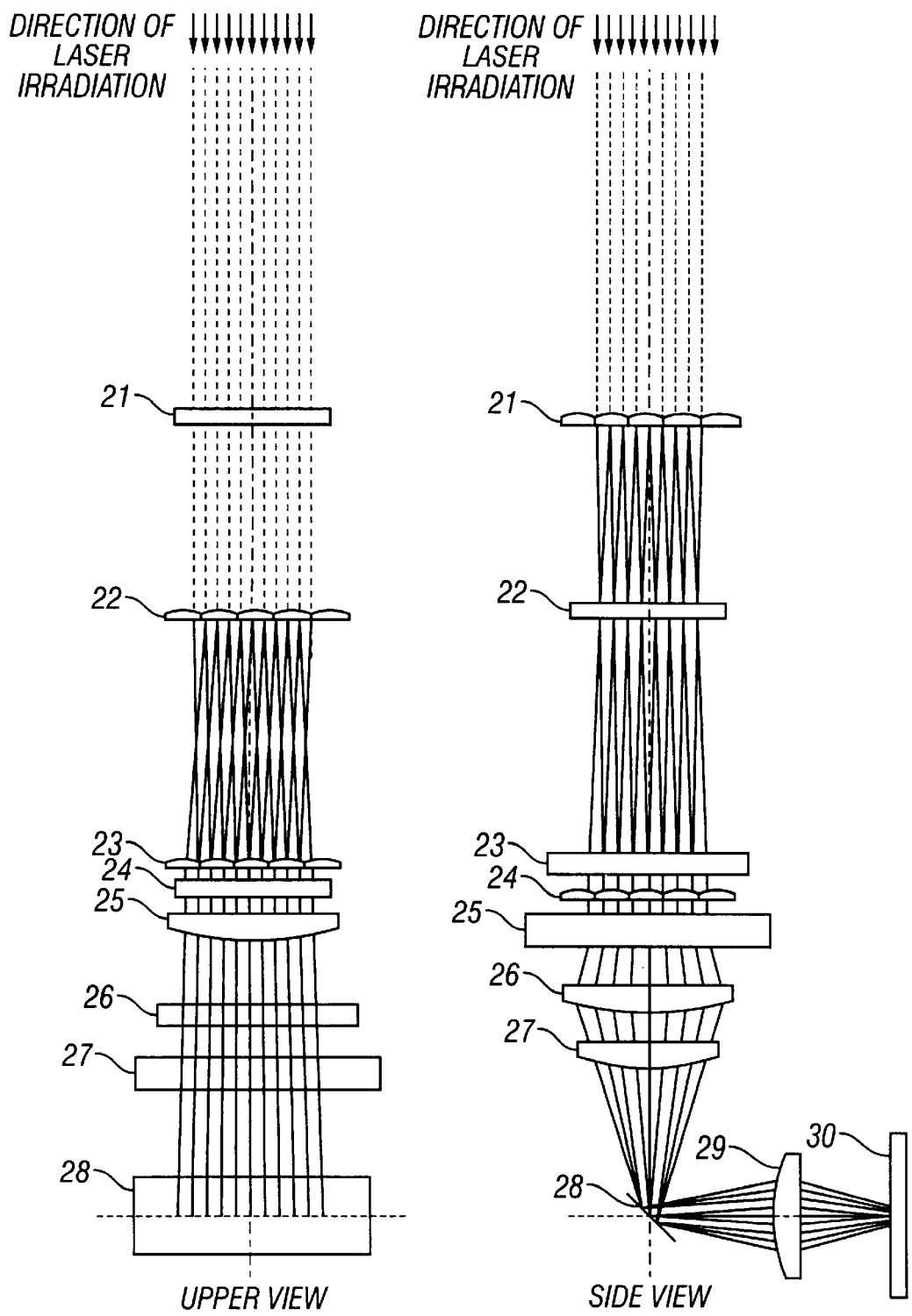
FIG. 12 shows a scheme of another optical system of a laser device.

The present example refers to a constitution of an optical system of a laser irradiation device shown in FIG. 7. FIG. 12 is referred to for the description. In FIG. 12, the laser light emitted from a generator (not shown) is incident to a homogenizer 21. The homogenizer 21 has functions of correcting the density distribution of the irradiation energy in the width direction of the laser beam which is finally shaped into a linear laser beam.

Reference numerals 22 and 23 denote homogenizers which have functions of correcting the distribution of the density of radiation energy in the longitudinal direction of laser beam finally linearly shaped.

The laser having an irradiation energy thus controlled by the homogenizers 21, 22, 23, and 24 is incident to a lens system comprising lenses 25, 26, and 27. In the lens system, the linear beam is first shaped in the longitudinal direction by the lens 25. That is, the laser is extended in the lens 25.

In lenses 26 and 27, the linear laser light is shaped in the width direction. That is, the laser light is converged. A mirror 28 is provided to change the traveling direction of the laser.

The laser whose traveling direction is changed by the mirror 28 is then incident to a lens 29. The lens 29 is provided also to shape the linear beam in the width direction. The laser transmitted through the lens 29 is irradiated to the object plane 30 as a linear laser beam.

The object surface 30 corresponds to, for example, a surface of an amorphous silicon film or a surface of a crystalline silicon film whose crystallinity is to be further ameliorated. In the constitution shown in the present example again, the matter of concern is to constrain the fluctuation in the irradiation energy density of the irradiated laser per pulse in a range as shown in FIG. 1.

EXAMPLE 12

Figure 13:
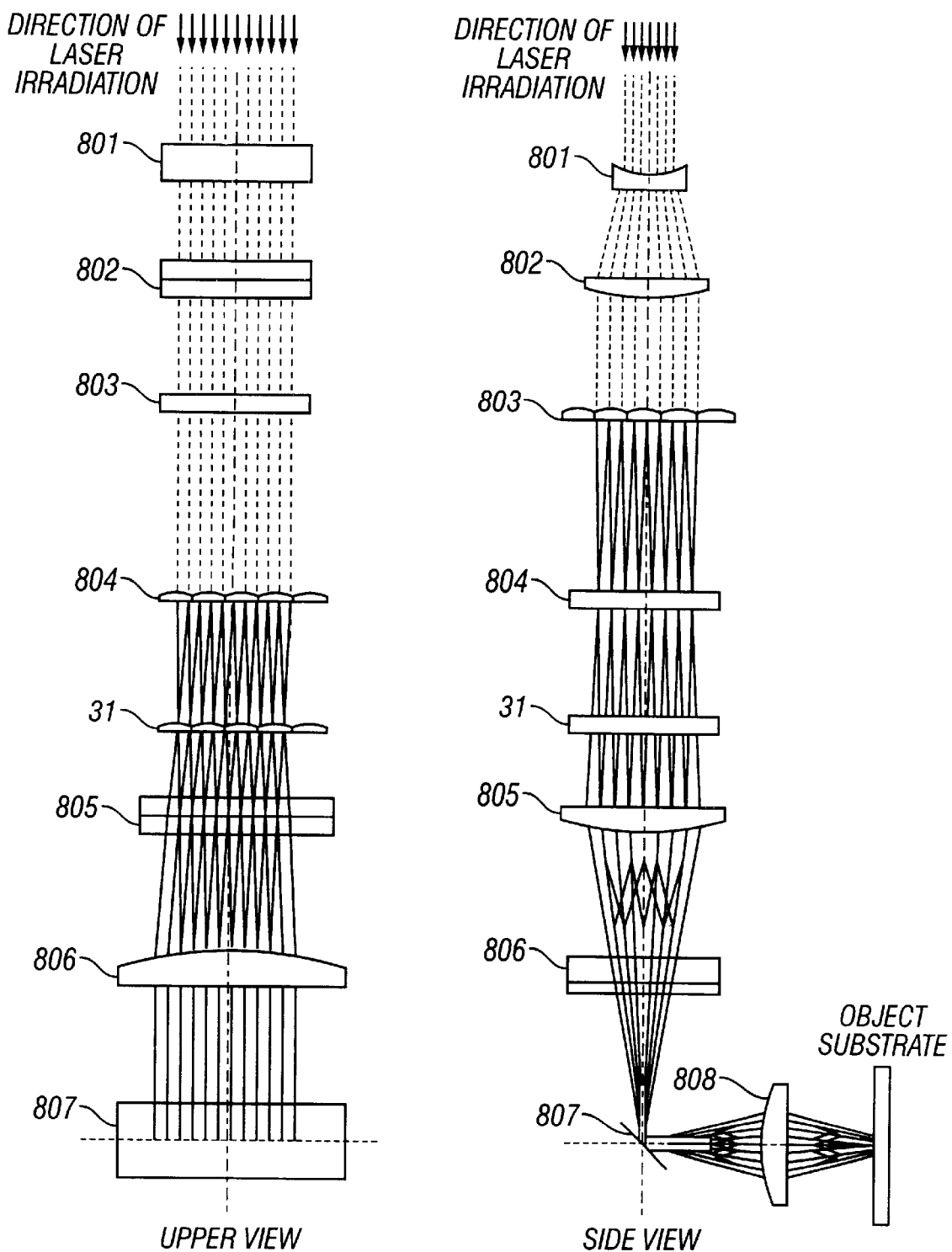
FIG. 13 shows a scheme of a still other optical system of a laser device.

The present example refers to a constitution in which the uniformity of the irradiation energy density in the longitudinal direction of the linear laser beam is ameliorated. FIG. 13 shows schematically the optical system of the laser irradiation device according to the present example.

Figure 8:
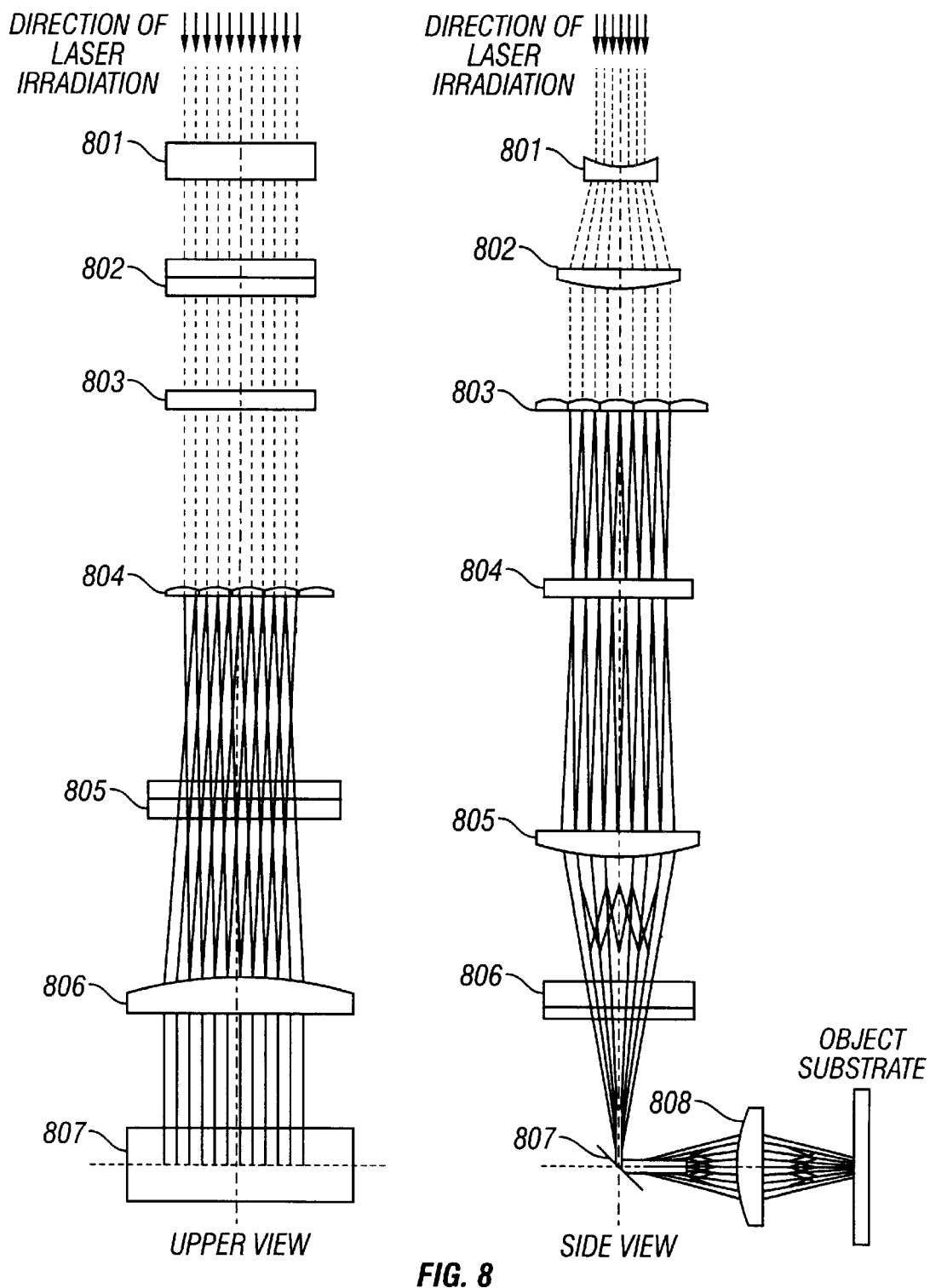
FIG. 8 shows a scheme of an optical system of a laser device.

Referring to FIG. 13, the device comprises an optical system similar to that shown in FIG. 8, but which is further improved. More specifically, the number of the homogenizers is differed in correspondence with the anisotropy of the beam shape. In FIG. 13, the portions that are the same as those in FIG. 8 are indicated with the same symbols used in FIG. 8.

More specifically, two homogenizers 804 and 31 are provided in the longitudinal direction of the linear laser, i.e., in the direction in which a higher uniformity is required for the density of the irradiation energy. In contrast to this, only one homogenizer 803, which corrects the irradiation energy density in the width direction of the linear laser, is provided in the width direction of the linear laser, because less uniformity in the irradiation energy density is required in this direction.

In a linear laser light, in general, the irradiation energy density distribution in the longitudinal direction of the beam is considered important. On the other hand, the density distribution in the width direction of a linear laser is not considered a problem because the width is confined within several millimeters.

Thus, as described in the present example, it is useful to increase the number of the homogenizers which correct the irradiation energy density in the longitudinal direction of a linear laser, thereby further increasing the uniformity in the distribution of the irradiation energy density.

The constitution according to the present invention is highly effective in implementing, in a high reproducibility, a further uniform annealing of a large area thin film semiconductor in using a pulse-emitting linear laser.

For instance, in the fabrication of an active matrix display device, the problems attributed to the fluctuation in the laser annealing effect using an excimer laser can be overcome. More specifically, the stripe patterns which were considered problematic in displaying an image can be ameliorated, thereby realizing a liquid crystal display device having a high image quality.

Furthermore, the invention disclosed herein is applicable not only to an active matrix liquid crystal display device, but also to active matrix-type EL display devices and other flat panel display devices.

While the invention has been described in detail, it should be understood that the present invention is not to be construed as being limited thereto, and that any modifications can be made without departing from the scope of claims.

What is claimed is:

1. A method for forming a semiconductors device comprising irradiating a pulse-emitting linear laser light onto a semiconductor film, wherein a pulse-to-pulse variation of the laser power is within a range of approximately ±3% and the semiconductor film has a thickness distribution within a range of ±5%.

2. A method according to claim 1, wherein the pulse-to-pulse variation of the laser power is within a range of approximately ±2%.

3. A method according to claim 1, wherein the laser light is irradiated for crystallizing the semiconductor film or for improving crystallinity of the semiconductor film.

4. A method of forming a semiconductor device comprising:

forming an amorphous semiconductor film having a film thickness distributed within a range of ±5% over a substrate having an insulating surface;

irradiating a laser light onto said amorphous semiconductor film thereby obtaining a crystalline semiconductor film:

patterning said crystalline semiconductor film into an island semiconductor layer;

forming a gate insulating film over said island semiconductor layer;

forming a gate electrode over s aid gate insulating film; and forming at least a source region or a drain region into said island semiconductor layer by doping impurity ions, wherein a channel forming region is formed under said gate electrode, wherein a pulse-to-pulse variation of the laser power is within a range of approximately ±3%.

5. A method according to claim 4, wherein a pulse-to-pulse variation of the laser power is within a range of approximately ±2%.

6. A method according to claim 4, wherein said pulse-emitting laser light is one selected from a group consisting of a KrF excimer laser, a XeCl excimer laser and fourth harmonics of a xenon-lamp excited Nd:YAG laser.

7. A method for fabricating a semiconductor device, comprising:
   forming an amorphous semiconductor film having a film thickness distributed within a range of ±5% over a substrate having an insulating surface;
   modifying the amorphous semiconductor film into a crystalline semiconductor film by irradiating a linear light from a pulse-emitting laser and/or by applying a heat treatment;
   implanting an impurity element which imparts a one conductive type to the crystalline semiconductor film; and
   activating the impurity element by irradiating a laser light and/or by applying a heat treatment;
   wherein a peak value, a peak width at half height, and a threshold width of a laser energy of the laser light in the step of modifying the amorphous semiconductor film into a crystalline semiconductor film and the the step of activating the impurity element above are each distributed within a range of approximately ±3% of a standard value.

8. A method according to claim 7, wherein the thin film semiconductor is a silicon film.

9. A method according to claim 7, wherein the peak value, the peak width at half height, and the threshold width of the laser energy are each distributed within a range of approximately ±1.5% of the standard value.

10. A method according to claim 7, wherein said pulse-emitting laser is one selected from a group consisting of an XeCl excimer laser, a KrF excimer laser and fourth harmonics of a xenon-lamp excited Nd:YAG laser.

11. A method according to claim 7, wherein the amorphous semiconductor film is formed by low pressure thermal CVD, and temperature within the surface of the substrate in forming the film an the surface of the substrate is distributed within a range of approximately ±1° C. of a standard value.

12. A method according to claim 7, wherein the irradiation of the laser light is performed under an atmosphere containing helium, and concentration of an impurity containing C (carbon) or N (nitrogen) element as a component thereof is 1 ppm or lower in the atmosphere.

13. A method according to claim 7, wherein temperature within the surface of the substrate in irradiating a laser light is distributed within a range of approximately ±5° C. of a standard value.

14. A method according to claim 7, wherein in irradiating a laser light, an auxiliary heating is applied to a region just before or just after the irradiation of the laser light, and temperature within the region is distributed within a range of approximately ±3° C. of a standard value.

15. A method according to claim 7, wherein the heat treatment in the second and the fourth steps are effected as such that temperature within the surface of the substrate is distributed within a range of approximately ±5° C. of a standard value.

16. A method according to claim 7, wherein,
   concentration of C and N elements in the vicinity of an interface of the crystalline semiconductor film is $2 \times 10^{19}$ cm$^{-3}$ or lower, and
   concentration of C and N elements in a bulk of the crystalline semiconductor film is $5 \times 10^{18}$ cm$^{-3}$ or lower.

17. A method according to claim 7, wherein a unit area of the thin film amorphous semiconductor is melted by the irradiation of the linear light of the step of modifying the amorphous semiconductor film into a crystalline semiconductor film for a period of time that is a sum total of threshold widths of respective linear laser pulses of the linear light irradiated to the unit area of the thin film amorphous semiconductor.

18. A method for forming a semiconductor device comprising:
   forming a semiconductor film having a film thickness distributed within a range of ±5% over a substrate having an insulating surface;
   annealing said semiconductor film by irradiating a linear laser light thereto inside a laser irradiation chamber; and
   purifying a gas atmosphere inside said laser irradiation chamber during the irradiation of said linear laser light,
   wherein a pulse-to-pulse variation of the laser power is within a range of approximately ±3%.

19. The method of claim 18 wherein an atmosphere inside said laser irradiation chamber contains helium during the irradiation of said linear laser light.

20. The method of claim 18 wherein pressure inside said laser irradiation chamber is 1 to 760 torr.

21. A method according to claim 18, wherein said pulse-emitting laser light is one selected from a group consisting of a KrF excimer laser, a XeCl excimer laser and fourth harmonics of a xenon-lame excited Nd:YAG laser.

22. A method for forming a semiconductor device comprising:
   forming a semiconductor film having a film thickness distributed within a range of ±5% over a substrate having an insulating surface;
   annealing said semiconductor film by irradiating a plurality of linear pulse laser beams thereto; and
   superposing said plurality of linear pulse laser beams on each other to scan said semiconductor film with said plurality of linear pulse laser beams,
   wherein a pulse-to-pulse variation of the laser power is within a range of approximately ±3%.

23. The method of claim 22 wherein said linear pulse laser beams are emitted from a XeCl excimer laser, a KrF excimer laser, an ArF excimer laser or Nd:YAG laser.

24. A method for forming a semiconductor device comprising:
   forming an amorphous semiconductor film having a film thickness distributed within a range of ±5% over a substrate having an insulating surface;
   irradiating a linear laser light onto said semiconductor film inside a laser irradiation chamber thereby obtaining a crystalline semiconductor film wherein
   a gas atmosphere inside said laser irradiation chamber is purified during the irradiation of said linear laser light;
   patterning said crystalline semiconductor film into an island semiconductor layer;
   forming a gate insulating film over said island semiconductor layer;
   forming a gate electrode over said gate insulating film; and
   forming at least a source region or a drain region into said island semiconductor layer by doping impurity ions, wherein a channel forming region is formed under said gate electrode,
   wherein a pulse-to-pulse variation of the laser power is within a range of approximately ±3%.

25. The method of claim 24 wherein said thickness of said semiconductor film is from 200 to 500 Å.

26. The method of claim 24 wherein an atmosphere inside said laser irradiation chamber contains helium during the irradiation of said linear laser light.

27. The method of claim 24 wherein pressure inside said laser irradiation chamber is 1 to 760 torr.

28. A method according to claim 24, wherein-said pulse-emitting laser light is one selected from a group consisting of a KrF excimer laser, a XeCl excimer laser and fourth harmonics of a xenon-lamp excited Nd:YAG laser.

29. A method for forming a semiconductor device comprising:
    forming a semiconductor film having a thickness of 100 to 1000 Å and having a film thickness distributed within a range of ±5% over a substrate having an insulating surface; and
    irradiating a plurality of linear pulse laser beams onto said semiconductor film, wherein
    said plurality of linear pulse laser beams are superposed on each other in scanning said semiconductor film with said plurality of linear pulse laser beams,
    wherein a pulse-to-pulse variation of the laser power is within a range of approximately ±3%.

30. The method of claim 29 wherein said thickness of said semiconductor film is from 200 to 500 Å.

31. The method of claim 29 wherein said liner pulse laser beams are emitted from a XeCl excimer laser, a KrF excimer laser, an ArF excimer laser or Nd:YAG laser.

32. A method for forming a semiconductor device comprising:
    forming an amorphous semiconductor film having a thickness of 100 to 1000 Å and having a film thickness distributed within a range of ±5% over a substrate having an insulating surface;
    irradiating a linear laser light onto said semiconductor film; and
    purifying a gas atmosphere inside said laser irradiation chamber during the irradiation of said linear laser light,
    wherein a pulse-to-pulse variation of the laser power is within a range of approximately ±3%.

33. The method of claim 32 wherein said thickness of said semiconductor film is from 200 to 500 Å.

34. The method of claim 32 wherein said thickness distribution is within a range of ±2.5%.

35. The method of claim 32 wherein an atmosphere inside said laser irradiation chamber contains helium during the irradiation of said liner laser light.

36. The method of claim 32 wherein pressure inside said laser irradiation chamber is 1 to 760 torr.

37. A method according to claim 32, wherein said pulse-emitting laser light is one selected from a group consisting of a KrF excimer laser, a XeCl excimer laser and fourth harmonics of a xenon-lamp excited Nd:YAG laser.

38. A method for forming a semiconductor device comprising:
    forming an amorphous semiconductor film having a thickness of 100 to 1000 Å and having a film thickness distributed within a range of ±5% over a substrate having an insulating surface;
    irradiating a linear laser light onto said semiconductor film, wherein
    a gas atmosphere inside said laser irradiation chamber is purified during the irradiation of said linear laser light;
    patterning said semiconductor film into an island semiconductor layer;
    forming a gate insulating film over said island semiconductor layer;
    forming a gate electrode over said gate insulating film; and
    forming at least a source region or a drain region into said island semiconductor layer by doping impurity ions, wherein a channel forming region is formed under said gate electrode,
    wherein a pulse-to-pulse variation of the laser power is within a range of approximately ±3%.

39. The method of claim 38 wherein said thickness of said semiconductor film is from 200 to 500 Å.

40. The method of claim 38 wherein said thickness distribution is within a range of ±2.5%.

41. The method of claim 38 wherein said linear pulse laser beams are emitted from a XeCl excimer laser, a KrF excimer laser, an ArF excimer laser or Nd:YAG laser.

42. A method for forming a semiconductor device comprising:
    forming an amorphous semiconductor film having a film thickness distributed within a range of ±5% over a substrate having an insulating surface;
    crystallizing said semiconductor film by irradiating a plurality of linear pulse laser beams thereto, thereby obtaining a crystalline semiconductor film
    patterning said crystalline semiconductor film into an island semiconductor layer;
    forming a gate insulating film over said island semiconductor layer;
    forming a gate electrode over said gate insulating film; and
    forming at least a source region or a drain region into said island semiconductor layer by doping impurity ions, wherein a channel forming region is formed under said gate electrode,
    wherein a pulse-to-pulse variation of the laser power is within a range of approximately ±3%.

43. The method of claim 42 wherein said linear pulse laser beams are emitted from a XeCl excimer laser, a KrF excimer laser, an ArF excimer laser or Nd:YAG laser.

44. A method for forming a semiconductor device comprising:
    forming an amorphous semiconductor film comprising silicon having a film thickness distributed within a range of ±5% over a substrate having an insulating surface;
    introducing into said amorphous semiconductor film a metal element which accelerates crystallization of said amorphous semiconductor film;
    heating said amorphous semiconductor film after said introducing step to obtain a crystalline semiconductor film;
    irradiating a plurality of linear pulse laser beams to said crystalline semiconductor film to improve crystallinity of said crystalline semiconductor film,
    patterning said crystalline semiconductor film into an island semiconductor layer;
    forming a gate insulating film over said island semiconductor layer;
    forming a gate electrode over said gate insulating film; and
    forming at least a source region or a drain region into said island semiconductor layer by doping impurity ions, wherein a channel forming region is formed under said gate electrode, wherein a pulse-to-pulse variation of the laser power is within a range of approximately ±3%.

45. The method of claim 44 wherein said linear pulse laser beams are emitted from a XeCl excimer laser, a KrF excimer laser, an ArF excimer laser or Nd:YAG laser.

46. A method for forming a semiconductor device comprising:

maintaining purity of an excitation gas in a laser generator by a gas processor connected to said laser generator;

emitting a linear laser light from said laser generator; and annealing a semiconductor film by irradiating said linear laser light thereto, wherein a pulse-to-pulse variation of the laser power is within a range of approximately ±3%.

47. A method according to claim 46, wherein said pulse-emitting laser light is one selected from a group consisting of a KrF excimer laser, a XeCl excimer laser and fourth harmonics of a xenon-lamp excited Nd:YAG laser.

* * * * *